(12) United States Patent
Hasegawa et al.

(10) Patent No.: US 6,841,399 B2
(45) Date of Patent: Jan. 11, 2005

(54) METHOD OF MANUFACTURING MASK AND METHOD OF MANUFACTURING SEMICONDUCTOR INTEGRATED CIRCUIT DEVICE

(75) Inventors: Norio Hasegawa, Hinode (JP); Katsuya Hayano, Akishima (JP); Shinji Kubo, Fussa (JP); Yasuhiro Koizumi, Tokyo (JP); Hironobu Takaya, Tokyo (JP); Morihisa Hoga, Tokyo (JP)

(73) Assignees: Renesas Technology Corp., Tokyo (JP); Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 10/349,026

(22) Filed: Jan. 23, 2003

(65) Prior Publication Data

US 2003/0139055 A1 Jul. 24, 2003

(30) Foreign Application Priority Data

Jan. 24, 2002 (JP) .................................... 2002-015525
Jul. 11, 2002 (JP) .................................... 2002-202071

(51) Int. Cl.$^7$ .............................................. H01L 21/00
(52) U.S. Cl. .............................. 438/4; 438/16; 438/949
(58) Field of Search ........................... 438/4, 7, 12, 16, 438/949

(56) References Cited

U.S. PATENT DOCUMENTS

| | | | |
|---|---|---|---|
| 4,623,256 A | * 11/1986 | Ikenaga et al. | 356/394 |
| 4,684,971 A | 8/1987 | Payne | 257/372 |
| 5,123,743 A | * 6/1992 | Feldman | 356/394 |
| 5,376,483 A | 12/1994 | Rolfson | 430/5 |
| 5,378,585 A | 1/1995 | Watanabe | 430/176 |
| 5,389,474 A | 2/1995 | Iguchi et al. | 430/5 |
| 5,418,092 A | 5/1995 | Okamoto | 430/5 |
| 5,556,724 A | 9/1996 | Tarumoto et al. | 430/5 |
| 5,741,613 A | 4/1998 | Moon et al. | 430/5 |
| 5,742,386 A | * 4/1998 | Nose et al. | 356/237.2 |
| 5,948,572 A | 9/1999 | Liu et al. | 430/5 |
| 5,989,760 A | 11/1999 | Mangat et al. | 430/22 |

FOREIGN PATENT DOCUMENTS

| | | |
|---|---|---|
| JP | 58-30129 A | 3/1981 |
| JP | 59-22050 A | 2/1984 |
| JP | 5-289307 A | 11/1993 |
| JP | 5-289307 | 11/1993 |

OTHER PUBLICATIONS

"Story About The Photomask Technique", pp. 63–76, no date.

* cited by examiner

Primary Examiner—Chandra Chaudhari
(74) Attorney, Agent, or Firm—Antonelli, Terry, Stout & Kraus, LLP

(57) ABSTRACT

The manufacturing time of a mask is shortened. In a defect inspection of a mask having a light-shielding portion composed of a resist film, the presence or absence of defects, such as burr and film loss of a resist pattern on the mask, and foreign matters, etc. is inspected by reading optical information on either or both of reflection light and transmission light with respect to inspection light irradiated to the mask by the use of a foreign-matter inspection system. More specifically, in the inspection of the mask, it is possible to perform the defect inspection without performing a comparison inspection that requires a great amount of measuring time and advanced techniques. Therefore, the inspecting process of the mask can be simplified, and also the inspecting time of the mask can be shortened.

38 Claims, 20 Drawing Sheets

METHOD OF MANUFACTURING MASK AND METHOD OF MANUFACTURING SEMICONDUCTOR INTEGRATED CIRCUIT DEVICE

BACKGROUND OF THE INVENTION

The present invention relates to a method of manufacturing a mask and a manufacturing technique of a semiconductor integrated circuit device, and more particularly to a technique effectively applied to an exposure technique.

A standard mask used in an exposure technique has a structure in which a light-shielding pattern, composed of a metal film made of, for example, chromium or the like, is provided on a mask substrate transparent to exposure light. The mask is manufactured in the following manner, for example. First, a metal film made of chromium or the like for shielding light is deposited on a transparent mask substrate, and an electron beam sensitive resist film is coated thereon. Subsequently, electron beam is irradiated to a predetermined portion on the electron beam sensitive resist film by the use of an electron beam writing apparatus or the like, and then the resist film is developed to form a resist pattern. Thereafter, the lower-layer metal film is etched with using the resist pattern as an etching mask, thereby forming the light-shielding pattern composed of the metal film. Finally, the remaining electron beam sensitive resist film is removed to manufacture the mask. However, in the mask having the above-described structure, there are a problem of the fact that the costs become high because the number of process steps is large, and a problem of the fact that the dimensional accuracy in the process is reduced because the light-shielding patterns are processed by isotropic etching. As a technique taking into consideration these problems, for example, Japanese Patent Laid-Open No. 5-289307 discloses a technique in which the light-shielding pattern on the mask substrate is composed of a resist film by making use of a standard electron beam sensitive resist film and a light sensitive resist film having a transmittance of 0% to the ArF excimer laser. Note that in pp. 63 to 75 of "Story about the photomask technique" first impression of the first edition published on Aug. 20, 1996 by Kogyo Chosakai Publishing Co., Ltd, a mask-defect inspection technology and a mask-defect repair technology and the like are described in detail.

SUMMARY OF THE INVENTION

According to the mask having the above-mentioned light-shielding pattern composed of a resist film, it is possible to eliminate the process for etching chromium and that for removing the resist film. Therefore, the shortening of mask manufacturing time, the improvement in the dimensional accuracy of patterns on a mask, the reduction in the defects, the reduction in the cost of the mask, and the like can be achieved. However, since the mask having the light-shielding pattern composed of a resist film begins being examined only just, there arises a problem of no consideration sufficiently given to how to improve the throughput of the defect inspection in the actual production of the mask.

An object of the present Invention is to provide a technique capable of shortening the manufacturing time of a mask.

Another object of the present invention is to provide a technique capable of reducing the manufacturing time of a semiconductor integrated circuit device.

The above and other objects and novel characteristics of the present invention will be apparent from the description of this specification and the accompanying drawings.

The typical ones of the inventions disclosed in the present application will be briefly described as follows.

More specifically, an aspect of the present invention is a method of manufacturing a mask in which a light-shielding portion is composed of a resist film, the method comprising the step of inspecting said mask by reading optical information on either or both of reflection light and transmission light with respect to inspection light irradiated to the mask.

In addition, another aspect of the present invention has the steps of: irradiating inspection light to a mask having a light-shielding portion composed of a resist film; inspecting said mask by reading optical information on at least one of reflection light and transmission light obtained from said mask by the irradiation of said inspection light; and transferring a desirable pattern onto a resist film on a wafer by a reduction projection exposure process that employs the mask obtained through said inspecting step.

DESCRIPTION OF THE PREFERRED EMBODIMENTS

Figure 1:
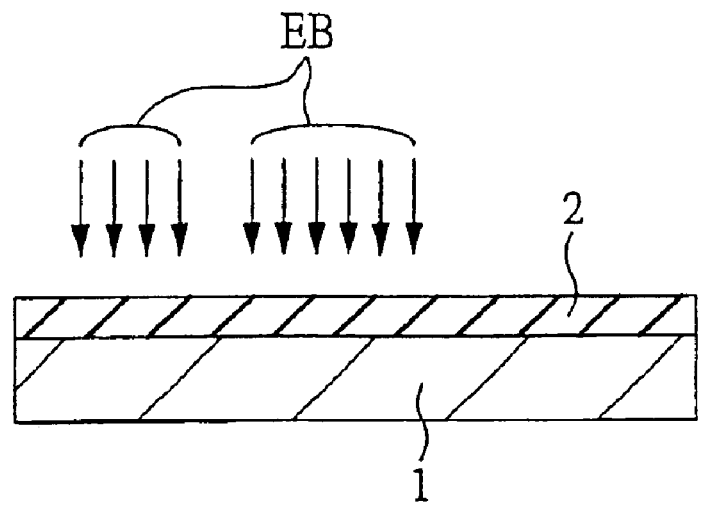
FIG. 1 is a cross-sectional view showing the principal part of a mask during a manufacturing process according to an embodiment of the present invention.

In advance of the detail description of the present invention in this application, technical terms employed in this application will be described as follows.

1. A wafer refers to a silicon single crystal substrate (semiconductor wafer or semiconductor integrated circuit wafer; approximately circular shape in general), a sapphire substrate, a glass substrate, other insulation or semi-insulation substrate, a semiconductor substrate, or a compound substrate thereof, used in the manufacture of a semiconductor integrated circuit.

2. A device surface refers to a main surface of a wafer, on which device patterns corresponding to a plurality of chip regions are formed by photolithography.

3. Mask: A mask refers to a general term of a substrate on which an original picture of patterns is drawn, and it includes a reticle on which a pattern several times larger in size than an actual pattern is formed. It is used in an exposure apparatus using visible light and ultraviolet light, etc. The mask includes a normal mask, a phase shift mask, and a resist mask.

4. Normal mask (metal mask or chromium mask): A normal mask refers to a standard mask in which mask patterns are formed of light-shielding patterns made of metal and light-transmitting patterns, on a transparent mask substrate.

5. Halftone phase shift mask: A halftone phase shift mask refers to a kind of a phase shift mask, in which transmittance of a halftone film serving as both of a shifter (halftone shifter) and a light-shielding film is within a range of 1% to 40%, and a phase shifter (halftone shifter) amount of the above-mentioned halftone film is an amount capable of inverting a phase of light with respect to transmission light through portions not having the halftone shifter.

6. Resist mask or resist light-shielding mask: A resist mask mentioned in this application refers to a mask, in which a film containing photosensitive resist as a base is exposed by an energy beam lithography technique using electron beam (ion beam) or light (ultraviolet light such as vacuum ultraviolet light, far ultraviolet light, and near ultraviolet light, etc. and visible light) or the like, or by a photolithography technique, thereby being patterned on a mask substrate. Where serving as a light-shielding film, the mask shields a part or all of ultraviolet light such as vacuum ultraviolet light, far ultraviolet light, and near ultraviolet light, etc. and of visible light. Photosensitivity is an inherent attribute of the resin itself (however, light absorbing agent and light scattering substance may be added if necessary), and an emulsion mask or the like, in which an added composition such as silver halide or the like forms the main part of the photosensitivity, is not included in the resist mask mentioned here in principle. More specifically, the light-shielding film mentioned here is not one exerting its desirable light-shielding properties only after development but one having already exerted its light-shielding properties before the development or at the time of coating or the like on the mask substrate. However, it goes without saying that the light-shielding film allows containing a variety of additives including the foregoing. The resist generally contains an organic resin as a main resin component, but allows adding inorganic matters.

7. In the field of semiconductor, ultraviolet light is classified as follows: ultraviolet light having a wavelength below about 400 nm and of about 50 nm or longer; near ultraviolet light having a wavelength of 300 nm or longer; far ultraviolet light having a wavelength below 300 nm and of 200 nm or longer; and vacuum ultraviolet light having a wavelength below 200 nm. Note that, needless to say, main embodiments of this application can be performed even within a far ultraviolet range generated by KrF excimer laser having a wavelength below 250 nm and of 200 nm or longer. In addition, the principle of the present invention can also be applied even within a short-wavelength edge range of ultraviolet light having a wavelength below 100 nm and of 50 nm or longer and within a short-wavelength edge range of visible light having a wavelength from about 400 nm to about 500 nm.

8. When "light-shielding (light-shielding region, light-shielding film, and light-shielding pattern, etc.)" is mentioned, it means that it has optical properties of transmitting less than 40% of exposure light irradiated onto its region. Generally, several % to less than 30% of the exposure light is used. More particularly, In the case of a binary mask (or binary light-shielding pattern) used as a substitute of a conventional chromium mask, the transmittance in the light-shielding region is almost 0, namely, below 1%, desirably below 0.5%, more practically below 0.1%. Meanwhile, if "transparent (transparent film and transparent region)" is mentioned, it means that it has optical properties of transmitting 60% or more of exposure light irradiated onto its region. The transmittance in the transparent region is almost 100%, that is, 90% or more, more desirably 99% or more.

9. When "metal" is mentioned concerning a light-shielding material of a mask, it indicates chromium, chromium oxide, or compounds similar to the other metal, and more widely includes a single substance, compound, and complex, etc. containing metal element, each of which has a light-shielding function.

10. A resist film generally is composed of such main components as organic solvent, base resin and photosensitive material, and of some other components to be added. The resist film refers to one in which: exposure light such as ultraviolet light or electron beam or the like causes a photosensitive material to happen a photochemical reaction; a reactant obtained from the photochemical reaction, or a reaction that uses as a catalyst a reactant obtained from the photochemical reaction largely changes a dissolution rate of a base resin into developer; and patterns are formed by exposure and development performed after the exposure. While a resist whose the dissolution rate of the base resin into the developer in one's exposure portions changes from small to large is called a positive resist, a resist whose the dissolution rate of the base resin into the developer in one's exposure portions changes from large to small is called a negative resist. In a usual resist film, no inorganic materials are included as main components. However, a resist film containing Si is included in this resist film by way of exception. The difference between a usual resist film and a photosensitive SOG (Spin On Glass) is that Si—O and Si—N and the like are included as the main components of the photosensitive SOG and these are inorganic materials. The main frame of the photosensitive SOG is $SiO_2$. The difference between organic and inorganic matters is determined whether or not $CH_3$ and the like are coupled to its edge portion. In general, the one terminated with the organic matter is more stable and widely used. However, the one terminated with any one of the organic and inorganic matters may also be used regardless of a main portion of the photosensitive SOG.

11. When a semiconductor integrated circuit device is mentioned, it includes not only one formed on a semiconductor substrate such as a silicon wafer and a sapphire substrate, etc. or on an insulating substrate but also, particularly unless otherwise specified, includes one formed on other insulating substrate such as glass etc., for example, TFT (Thin Film Transistor) and STN (Super-Twisted-Nematic) liquid crystal, etc.

12. Hole pattern: A hole pattern refers to a fine pattern such as a contact hole and a through hole, etc. having a two-dimensional dimensions nearly equal to or smaller than that of the wavelength of exposure light on a wafer. In general, it is formed in the shape of a square or a rectangular similar to the square, or of an octagon etc. on a mask. However, it is formed in a shape nearly equal to that of a circle on the wafer in many cases.

13. Line pattern: A line pattern refers to a stripe-shaped pattern for forming a wiring or the like on a wafer.

Embodiments described below will be described by dividing into a plurality of sections or further embodiments when required as a matter of convenience. However, these sections or further embodiments are not irrelevant to each other unless otherwise specified, and one of them relates to a modification example, details, a supplementary explanation, or the like that includes the entire or a part of the others.

Also, in the following embodiments, when referring to the number of elements (including number of pieces, values, amounts, ranges, or the like), the number of the elements is not limited to a specific number unless otherwise specified or except the case where the number is apparently limited to a specific number in principle. The number may larger or smaller than a specific number.

Further, in the following embodiments, it goes without saying that the components (including element steps etc.) are not always indispensable unless otherwise specified or except the case where the components are apparently indispensable in principle.

Similarly, in the following embodiments, when the shape of the components, the positional relation thereof, and the like are mentioned, the substantially approximate and similar shapes and the like are included therein unless otherwise specified or except the case where it can be thought that they are apparently excluded in principle. This condition is also applicable to the numerical value and the range described above.

The components having the same function are denoted by the same reference symbols throughout the drawings for describing the embodiments, and the repetitive description thereof will be omitted Also, in the drawings used in the embodiments, some plan views may be hatched because they are easy to see.

Also, in the embodiments, a MISFET (Metal Insulator Semiconductor Field Effect Transistor) representing a field effect transistor is abbreviated as MIS, and a p channel MISFET is abbreviated as pMIS, and an n channel MISFET is abbreviated as an nMIS.

Embodiments of the present invention will be described below in detail based on the accompanying drawings.

(First Embodiment)

Figure 2:
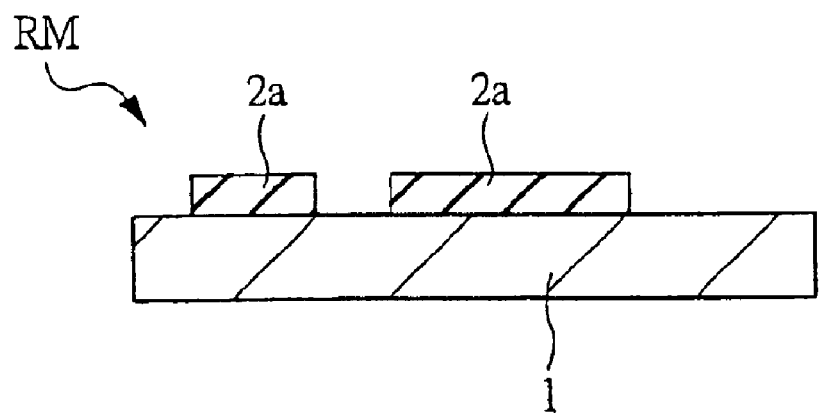
FIG. 2 is a cross-sectional view showing the principal part of a mask during the manufacturing process subsequent to FIG. 1.

FIGS. 1 and 2 are cross-sectional views showing the principal part of a mask during the manufacturing process according to a first embodiment. First, as shown in FIG. 1, a mask substrate 1 constituting a mask according to the first embodiment is prepared. This mask substrate 1 is composed of, for example, a tabular synthetic quartz glass plate that is transparent to exposure light, and has a first main surface and a second surface opposite to the first main surface (rear surface). Subsequently, a negative electron beam sensitive resist film 2 is coated on the first main surface of the mask substrate 1, and then electron beam EB is selectively irradiated at desirable pattern portions thereof. Thereafter, a normal development process is performed to form resist patterns 2a in a desirable shape on the first main surface of the mask substrate 1 as shown in FIG. 2, whereby a mask RM is fabricated. Each resist pattern 2a is made of a material capable of shielding the exposure light of an exposure apparatus that uses the mask RM according to the first embodiment, and has properties of shielding the exposure light similarly to a chromium (Cr) film or the like used as a light-shielding material in the normal mask. Note that the resist mask similar to the mask RM according to the first embodiment is described in, for example, Japanese Patent Application No. 11-185221 (filed on Jun. 30, 1999), No. 2000-246466 (filed on Aug. 15, 2000), No. 2000-246506 (filed on Aug. 15, 2000), No. 2000-308320 (filed on Oct. 6, 2000), No. 2000-316965 (filed on Oct. 17, 2000), and No. 2000-328159 (filed on Oct. 27, 2000), etc. by the inventors of this invention.

Figure 3:
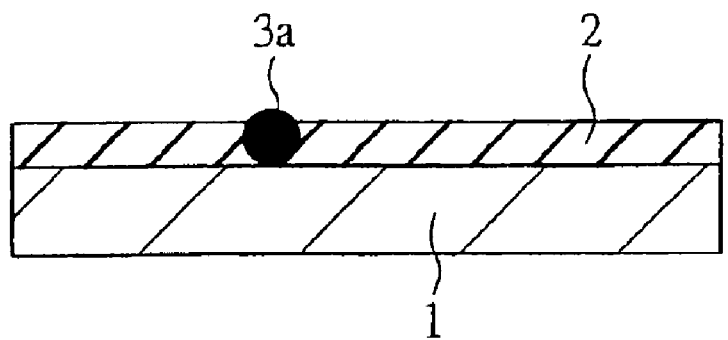
FIG. 3 is an explanatory diagram of conditions causing defects in a mask and of an inspecting method thereof according to an embodiment of the present invention.
Figure 4:
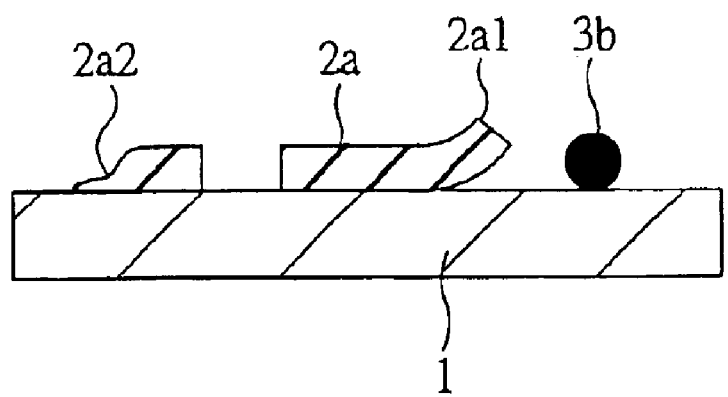
FIG. 4 is an explanatory diagram of conditions causing defects in a mask and of an inspecting method thereof according to an embodiment of the present invention.

Next, some conditions causing defects in a resist mask like the mask RM according to the first embodiment and a inspection method of the defects will be described based on FIGS. 3 and 4. FIGS. 3 and 4 are cross-sectional views showing the principal part of the mask during the manufacturing process. First, as shown in FIG. 3, when the electron beam sensitive resist film 2 is coated on the first main surface of the mask substrate 1, there is the possibility that a foreign matter 3a will exist in the electron beam sensitive resist film 2, causing the defects in forming patterns. In the first embodiment as an example for coping with this problem, the electron beam sensitive resist film 2 is coated, and thereafter the defect inspection is performed by a foreign-matter inspection system usually used in a manufacturing process of a semiconductor integrated circuit device and/or a manufacturing process of a mask. In the case of the presence of defects, the electron beam sensitive resist film 2 on the first main surface of the mask substrate 1 is removed, and then a reforming process for the substrate 1 is performed. Meanwhile, the resist-coated mask substrate 1 determined to be good in the defect inspection proceeds to a next process. More specifically, desirable resist patterns are formed on the main surface of the mask substrate 1 through a normal electron-beam writing process and a development process. FIG. 4 is a cross-sectional view showing the principal part of the mask substrate 1 after forming of the resist patterns 2a. In FIG. 4, the defects such as a foreign matter 3b, a burr 2a1 of the resist pattern 2a, and a film loss 2a2 of the resist pattern 2a, etc. are exemplified besides the desirable pattern 2a. In the first embodiment, such defects are inspected by the use of a foreign-matter inspection system similar to that described above.

Figure 5:
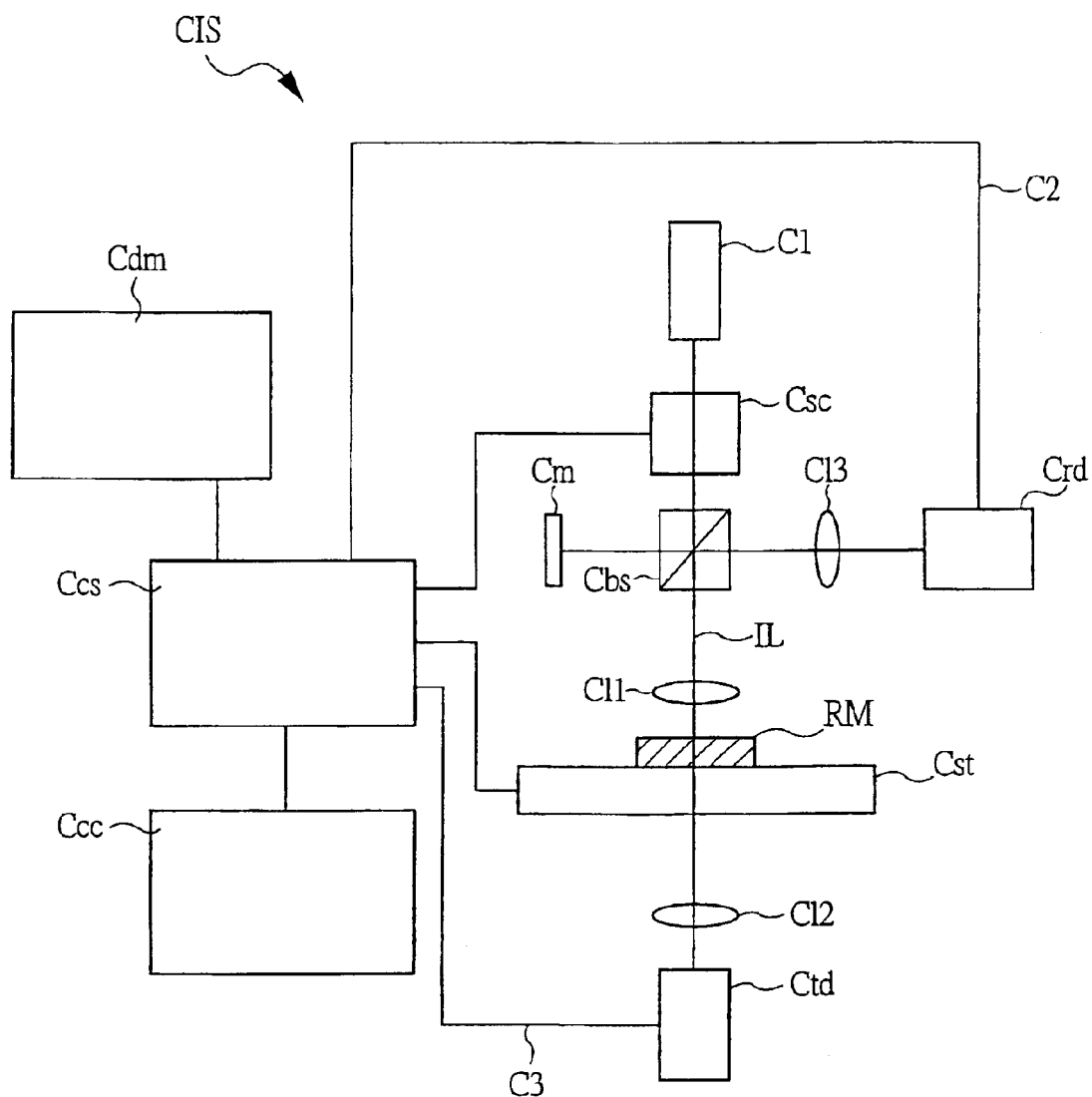
FIG. 5 is an explanatory diagram of a foreign-matter inspection system used in the inspection process of a mask according to an embodiment of the present invention.

The registered "STAR light" of KLA-Tencor is taken as a representative example of the above foreign-matter inspection system. An example of the foreign-matter inspection system will be described with reference to FIG. 5. This foreign-matter inspection system CIS can perform: an inspection made by the transmission light of inspection light irradiated to the mask RM; an inspection made by the reflection light thereof; an inspection made by both the transmission light and the reflection light; and an inspection made with respect to the phase shift principle. Thereby, the foreign-matter inspection system CIS can obtain various kinds of information from an object to be inspected (mask RM). Inspection light IL emitted from a laser source C1 passes through a scanner Csc and a beam splitter Cbs, and is irradiated via an objective lens C11 to the mask RM, which is the object to be inspected on a stage Cst. The mask RM is placed on the stage Cst, with the first main surface (i.e., the surface on which the resist patterns 2a are formed) being directed toward the laser source C1. The light transmitted through the mask RM passes through a condenser C12 and is detected in transmission light detector Ctd. Meanwhile, the light reflected from the mask RM passes through the beam splitter Cbs and a condense C13 and is detected in reflection light detector Crd. Detected signals are sent through paths C2 and C3 and processed in an intermediate system Ccs and a control computer Ccc, whereby the presence or absence of the defects is determined. Data on defect information etc. are stored in a database memory Cdm. As the inspection light, a laser beam having a long wavelength of, for example, 365 nm or 436 nm is used. Of course, short-wavelength light as the inspection light may be used. Thereby, a resolution capability of the inspection can be improved. Also, the reference symbol Cm in FIG. 5 denotes a mirror for forming such a light path as to generate the phase difference in making the inspection concerning the phase shift principle.

Figure 6:
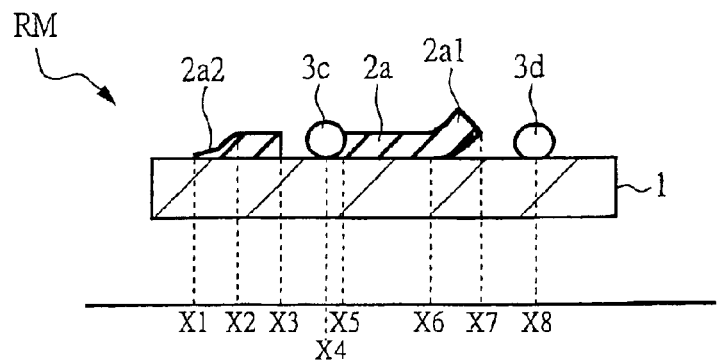
FIG. 6 is a cross-sectional view showing the principal part of a mask to be inspected by the foreign-matter inspection system shown in FIG. 5.
Figure 7:
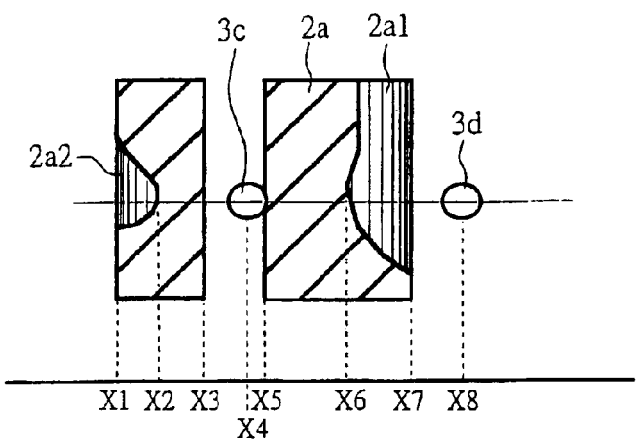
FIG. 7 is an explanatory diagram schematically showing a state of the mask surface shown FIG. 6 and to be inspected by the foreign-matter inspection system.
Figure 8:
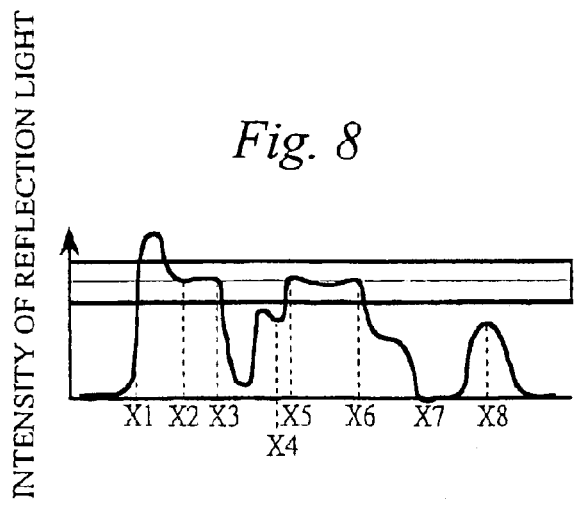
FIG. 8 is a graph schematically representing a state of the mask shown in FIG. 7 with a detection waveform detected in an intensity of reflection light.

Next, whether the mask inspection made by the foreign-matter inspection system CIS is right or wrong will be described. FIGS. 6 to 8 show the case where a resist mask is inspected by the foreign-matter inspection system CIS. FIG. 6 is a cross-sectional view showing the principal part of a resist mask (mask RM) having the above-mentioned defects thereon. Foreign matters 3c and 3d, the burr 2a1 of the resist pattern 2a, and the film loss 2a2 of the resist pattern 2a are shown as defective portions. Information obtained in detecting the reflection light from the mask RM is shown in FIG. 7. FIG. 7 schematically shows the state of the principal part of the objective surface of the mask RM to be inspected (i.e., the first main surface). The circular foreign matters 3c and 3d appear black due to the influence of the scattering of the inspection light irradiated. Meanwhile, the burr 2a1 and the film loss 2a2 are observed so that the state of interference of the inspection light in a surface of the electron beam sensitive resist film 2 is changed due to the influence of the change in effective film thickness of the electron beam sensitive resist film 2, and the change in the Intensity of the reflection light; and the change in the intensity of the reflection light can be observed. FIG. 8 is a graph schematically showing the state in FIG. 7 in terms of the detection waveform of the intensity of the reflection light. Portions, which have a light intensity deviated from a light intensity range obtained from the normal defect-free portions of the resist patterns 2a, correspond to the defective portions. As described above, in the first embodiment, it is possible to determine the presence or absence of the above-mentioned defects on the mask RM by detecting the difference in levels of the reflection light intensities obtained from the normal portions of the resist patterns 2a of the mask RM.

Figure 9:
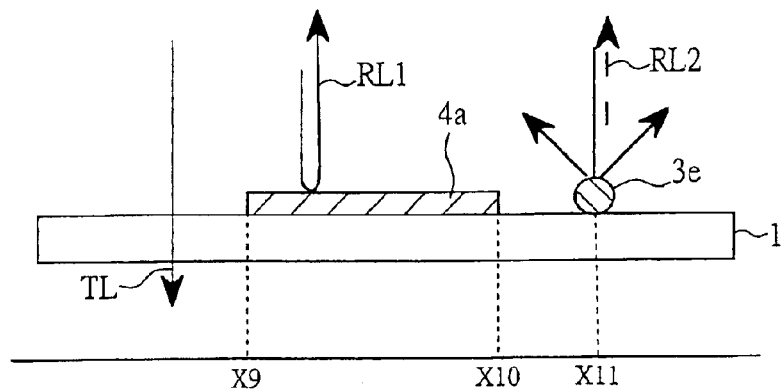
FIG. 9 is a cross-sectional view showing the principal part of a mask to be inspected.
Figure 10:
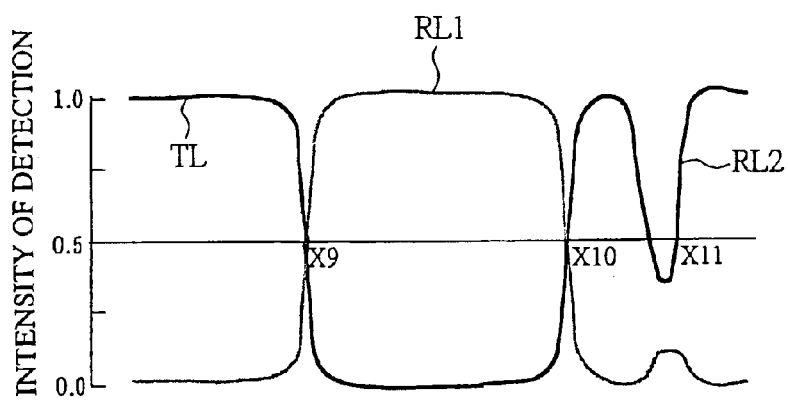
FIG. 10 is an explanatory diagram showing intensity distributions of reflection light and transmission light in the mask shown in FIG. 9.
Figure 11:
FIG. 11 is an explanatory diagram showing a distribution of difference between the intensities of the transmission light and the reflection light shown in FIG. 10.

In addition, it is also possible to efficiently detect defective portions of the mask based on the difference in light intensity between the reflection light and the transmission light, as shown in FIGS. 9 to 11. FIG. 9 is a cross-sectional view showing the principal part of a chromium mask to be inspected, FIG. 10 shows an intensity distribution of the reflection light and the transmission light in the chromium mask (normal mask) shown in FIG. 9, and FIG. 11 shows a distribution of the difference between the transmission light intensity and the reflection light intensity of FIG. 10. In this case, the case of a chromium mask will be described for the convenience of explanation. (Since the intensity of the reflection light and that of the transmission light are not clearly observed in the case of a resist mask, it is difficult to describe the difference thereof. Therefore, the case of a chromium mask will be described.) The transmission light TL and the reflection light RL1 from the chromium mask are inverted to each other depending on the presence or absence of a pattern 4a, whereby the difference therebetween is approximately 0 (zero). However, in the case where there exist a foreign matter 3e and the like on the chromium mask, the inspection light irradiated to the foreign matter 3e is diffusely reflected on the surface of the foreign matter 3e. As a result, the light intensity of the reflection light RL2 from the foreign matter 3e is reduced, thereby having a small value in comparison to that of the reflection light from the pattern 4a. Since large difference therebetween can be observed, it is possible to determine the existence of the defect. In the case of the mask RM, the high detection intensity thereof cannot be always obtained because the intensity of the reflection light changes depending on the thickness of the light-shielding film. However, it is possible to control the reflection intensity by adjusting the thickness of the light-shielding film. Also, a film thickness adjustment for enhancing the detection sensitivity thereof is effective in order to improve the discrimination rate between the normal patterns and the defects. More specifically, in the case where the transmittance of the resist pattern to the detection light is high, the intensity of the transmission light is increased. Therefore, it is desirable to reduce the intensity of the reflection light. For example, the resist film thickness is set to $\lambda/4n$, $3\lambda/4n$, and $5\lambda/4n$ (where $\lambda$ is a wavelength of the detection light and n is refractive index of the detection light by the resist film), etc. By so doing, the difference between the transmission light and the reflection light is reduced, whereby the discrimination rate of the defects is improved. Note that the above-mentioned conditions may not always be suitable due to the refractive index of the resist mask. However, what the inventors want to say here is that the adjustment of the thickness of the resist film is effective in order to improve the discrimination rate of the defects.

Since the electron beam sensitive resist film 2 is directly used as patterns in such resist mask, the desirable patterns and the defects (foreign matters) are different from each other in characteristics such as shape, transmittance, reflectance, and film thickness, etc. between the desirable patterns and the defects (foreign matter). Therefore, in the defect inspection of the mask RM according to the first embodiment, the presence of absence of the defects on the mask RM is determined by reading optical information obtained from: the reflection light from the mask RM: the transmission light through the mask RM; or both of the reflection light and the transmission light, relative to the detection light.

Figure 12:
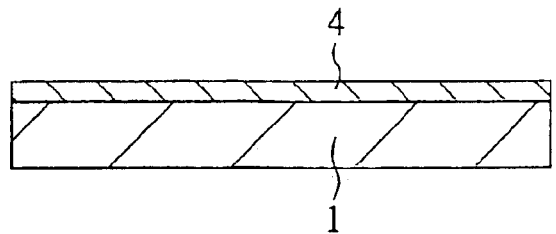
FIG. 12 is a cross-sectional view showing the principal part of a normal mask during the manufacturing process, examined by the present inventor(s).
Figure 13:
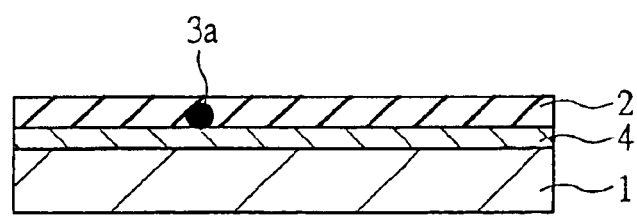
FIG. 13 is a cross-sectional view showing the principal part of the mask during the manufacturing process subsequent to FIG. 12.
Figure 14:
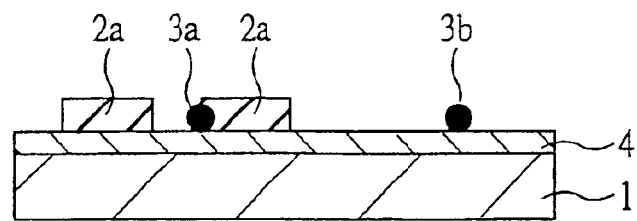
FIG. 14 is a cross-sectional view showing the principal part of the mask during the manufacturing process subsequent to FIG. 13.

In contrast, in the case of the normal mask, difficulty in making the defect inspection by the foreign-matter inspection system will be described. This causes the difference in the manufacturing processes of both masks. FIGS. 12 to 15 are cross-sectional views showing the principal part of the normal mask during the manufacturing process. Also, FIG. 16 is a cross-sectional view showing the principal part of the normal mask NM formed through the manufacturing processes shown in FIGS. 12 to 15. First, as shown in FIG. 12, a metal film 4 made of, for example, chromium (Cr) or the like is deposited on the first main surface of the mask substrate 1. Thereafter, the electron beam sensitive resist film 2 is coated on the metal film 4 by an normal method, as shown in FIG. 13. The case where the foreign matter 3a exists in the electron beam sensitive resist film 2 is exemplified here. Subsequently, the exposure and development processes are performed by a normal method to form the resist patterns 2a on desirable portions, as shown in FIG. 14. The case where foreign matters 3a and 3b already exist in this stage is exemplified here. Thereafter, a wet-etching process or dry-etching process is performed with using the resist patterns 2a as an etching mask, thereby etching-removing the metal film 4 exposed from the resist pattern 2a.

Figure 15:
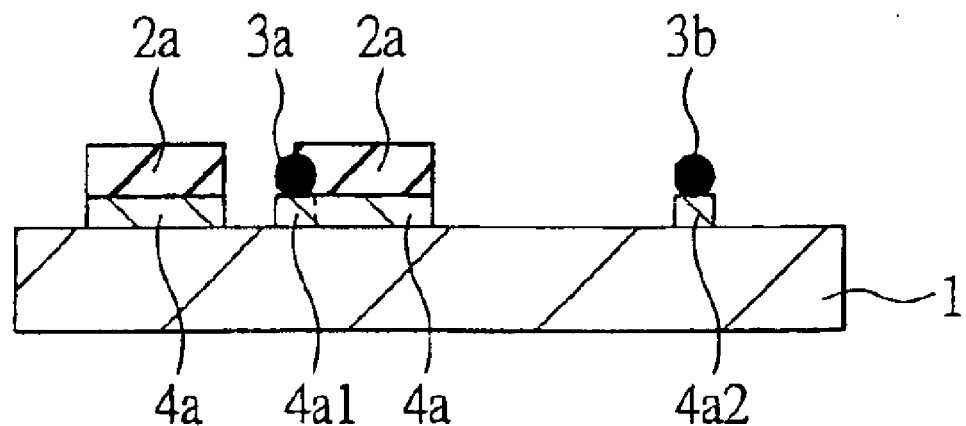
FIG. 15 is a cross-sectional view showing the principal part of the mask during the manufacturing process subsequent to FIG. 14.
Figure 16:
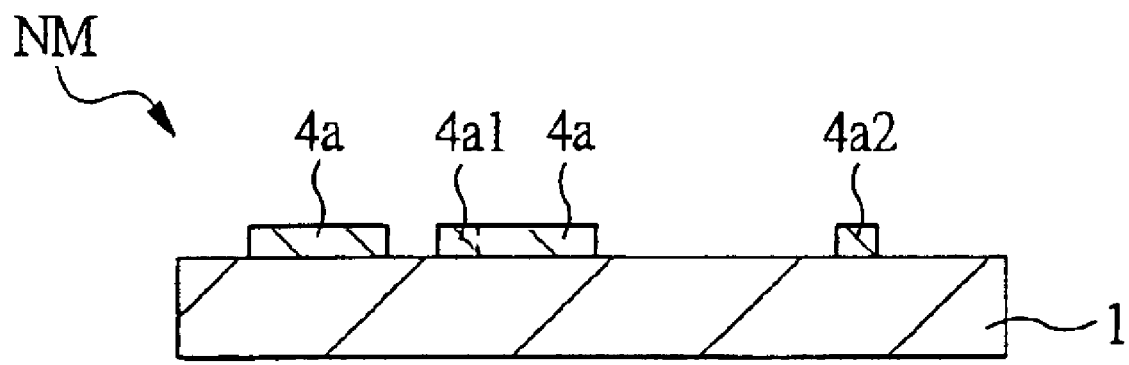
FIG. 16 is a cross-sectional view showing the principal part of the mask fabricated through the processes showing in FIGS. 12 to 15.

In this manner, the metal patterns 4a are formed as shown in FIG. 15. At this time, if the foreign matters 3a and 3b are present, the foreign matters 3a and 3b also function as an etching mask when the metal film 4 is selectively processed with using the resist patterns 2a as an etching mask. As a result, the patterns of the foreign matters 3a and 3b will be also transferred as metal patterns 4a1 and 4a2. Thereafter, the resist patterns 2a are removed and thus the normal mask NM having the metal patterns 4a as light-shielding patterns is completed, as shown in FIG. 16. However, the metal patterns 4a1 and 4a2 transferred by the foreign matters are also left as it is. More specifically, the desirable metal patterns 4a and the metal patterns 4a1 and 4a2 by the foreign matters may have the same characteristics.

Figure 17:
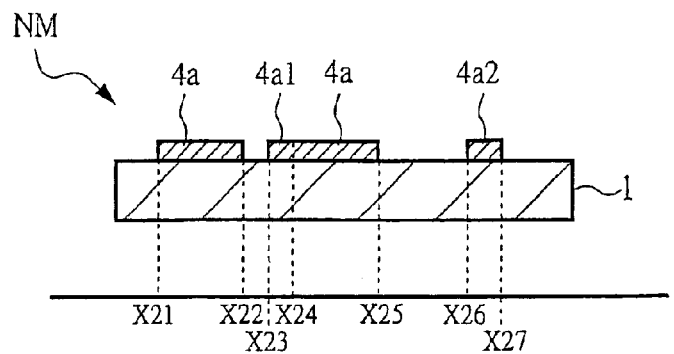
FIG. 17 is a cross-sectional view showing the principal part of a normal mask on which some defects exist.
Figure 18:
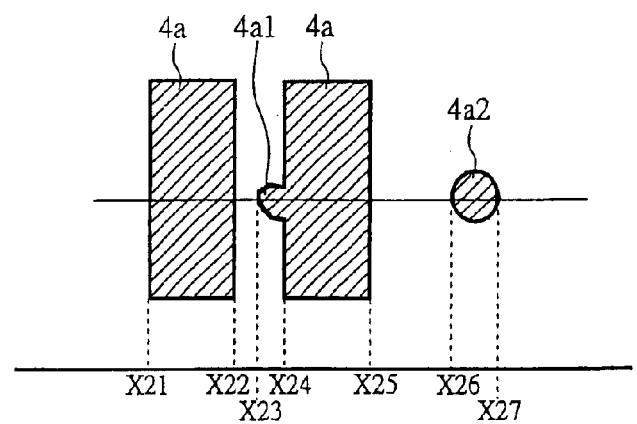
FIG. 18 is an explanatory diagram schematically showing a state of a normal mask surface shown in FIG. 17 and to be inspected by the foreign-matter inspection system.
Figure 19:
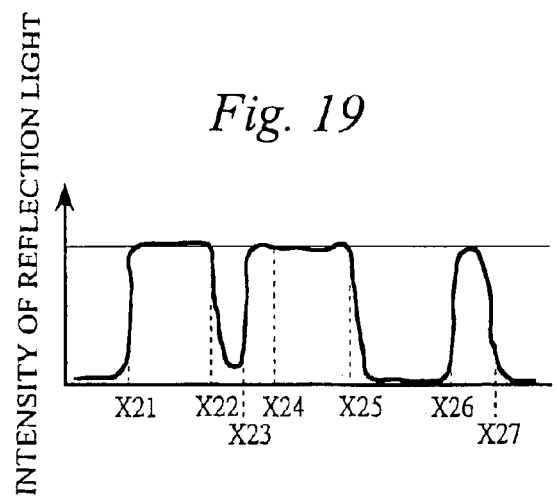
FIG. 19 is a graph schematically representing a state of the mask shown in FIG. 18 with a detection waveform detected in an intensity of reflection light.
Figure 20:
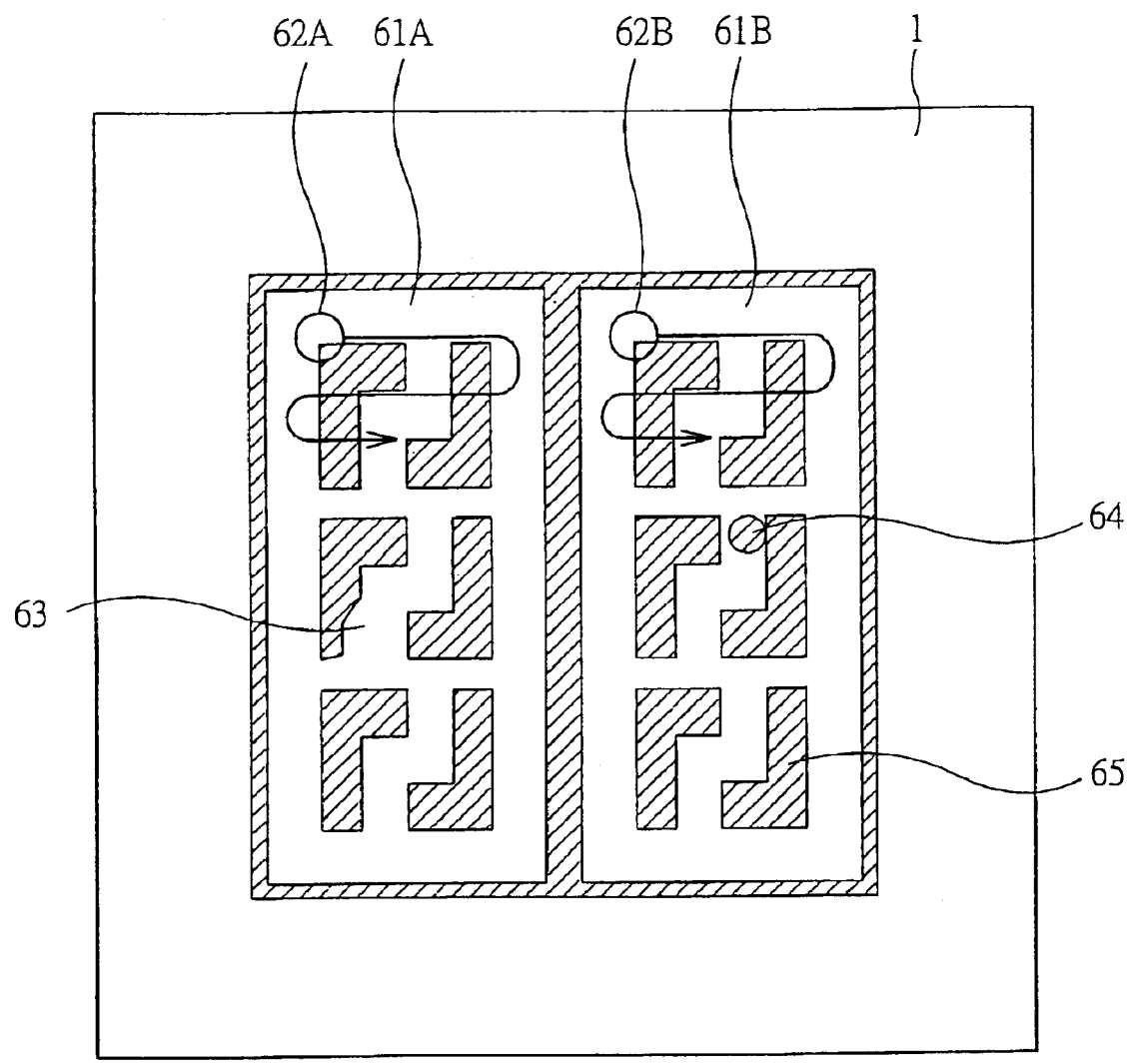
FIG. 20 is an entire plan view of a normal mask for explaining a die-to-die comparison inspection method.

Next, the results of the normal mask NM inspected by the above-mentioned foreign-matter inspection system are shown in FIGS. 17 to 19. FIG. 17 is a cross-sectional view showing the principal part of the normal mask (mask NM) on which the above-described defects exist. FIG. 18 represents information obtained in detecting the reflection light from the objective surface of the normal mask NM to be inspected (that is, first main surface). Since the desirable metal patterns 4a and the defective metal patterns 4a1 and 4a2 are each composed of a metal film made of chromium (Cr) or the like, no optical difference therebetween is obtained. FIG. 19 schematically shows the detection waveform of the intensity of the reflection light from the first main surface of the normal mask NM. It is understood that both the desirable metal patterns 4a and the defective metal patterns 4a1 and 4a2 with the defects have the same reflection light intensity and thus it is impossible to discriminate the desirable patterns and the defective patterns. Therefore, in the case of a mask obtained by processing a mask material such as a light-shielding film and a translucent film, etc., using a resist pattern as an etching mask similarly to the above-described normal mask and a halftone phase shift mask and the like, it is necessary to perform a comparison inspection such as a die-to-database comparison inspection method of comparing mask design data and an actual mask pattern after the processing, or a die-to-die comparison inspection method as shown in FIG. 20, or the like. The die-to-die comparison inspection method is one in which: if two or more identical chip transfer regions 61A and 61B exist on the first main surface of one mask NM, then the shapes of patterned portions 62A and 62B respectively corresponding to the chip transfer regions 61A and 61B are compared and inspected; and an occurrence of the difference between the transmission light signals at defective portions 63 and 64 is detected; and if so, it is determined that there exist the defects. The comparison inspection like this needs more measurement time in comparison to that of a foreign-matter inspection method. In addition, since advanced techniques are required in the defect inspection, the cost required for an inspection system is almost equal to that of a writing apparatus and is expensive. As a result, the shortening of time for supplying the masks is hindered, which results in the rise in the mask price.

Contrary to this, in the first embodiment, it has been found out that the defect detection can be made by the foreign-matter inspection system without using the above-mentioned comparison inspection, in the inspection of a resist mask (determination of the presence or absence of foreign matters and of the good or bad quality of desirable light-shielding patterns themselves). As a result, since the mask inspection can be largely simplified, the manufacturing time of the mask can be reduced, and the throughput of the mask manufacture can be improved and the shortening of the time for supplying the masks can be achieved. Therefore, it is possible to reduce the manufacturing time of a semiconductor integrated circuit device manufactured by the use of the mask, and the shortening of the time for supplying the semiconductor integrated circuit devices can be achieved. Also, since the expense required for the mask inspection can be reduced, the mask cost can be reduced. Accordingly, the cost of the semiconductor integrated circuit device manufactured by the use of the above-mentioned mask can be reduced.

However, the inspection process of the mask according to the first embodiment relates to the inspection of a novel mask such as a resist mask, and a basic concept thereof is to perform a defect inspection method without using the above-mentioned comparison inspection. One of the characteristics of the first embodiment is to determine the presence of absence of the defects by reading optical information from the defects themselves (foreign matters and the like) without using the comparison inspection (without using pattern information) in the mask inspection. Since the foreign-matter inspection system is used also in the foreign-matter inspection of the normal mask, its use is taken as the most preferred example from various viewpoints. The essence of the first embodiment is neither limited to the use of the foreign-matter inspection system in the mask inspection nor the simple use of the foreign-inspection system.

Next, examples of a specific structure of the resist mask according to the first embodiment will be described with reference to FIGS. 21 to 26.

Figure 21:
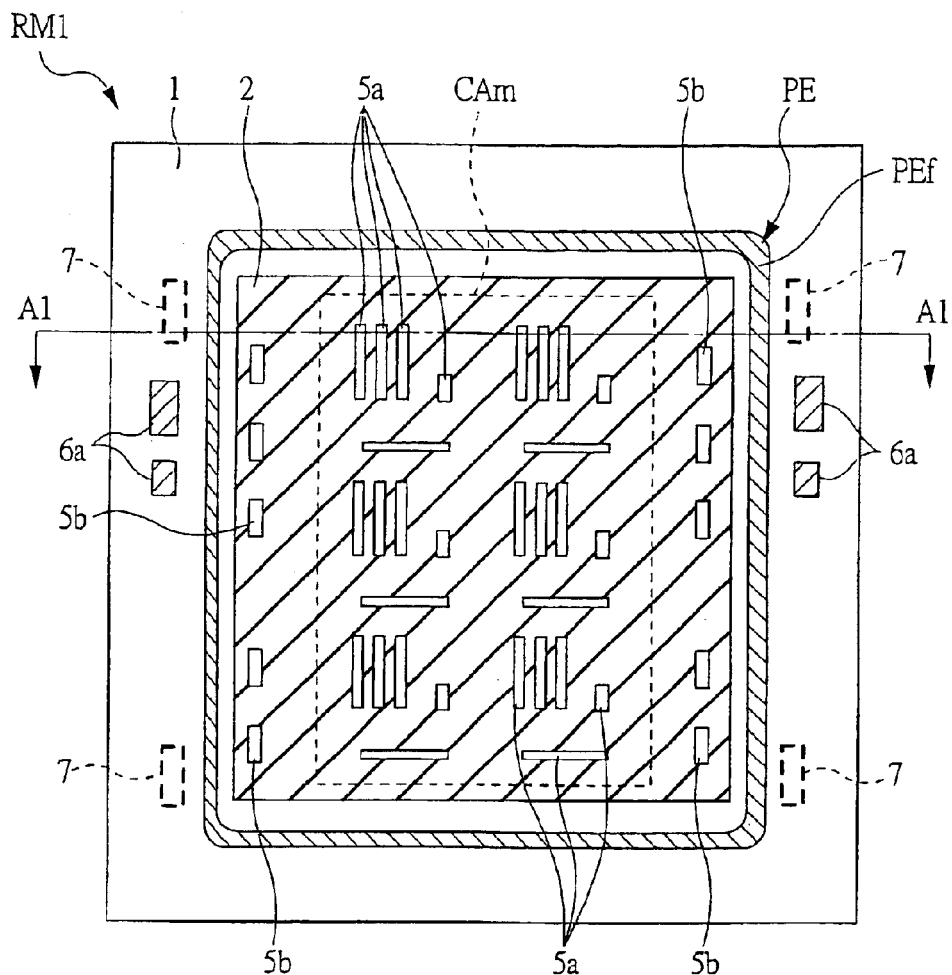
FIG. 21 is an entire plan view of a mask that is an embodiment of the present invention.
Figure 22:
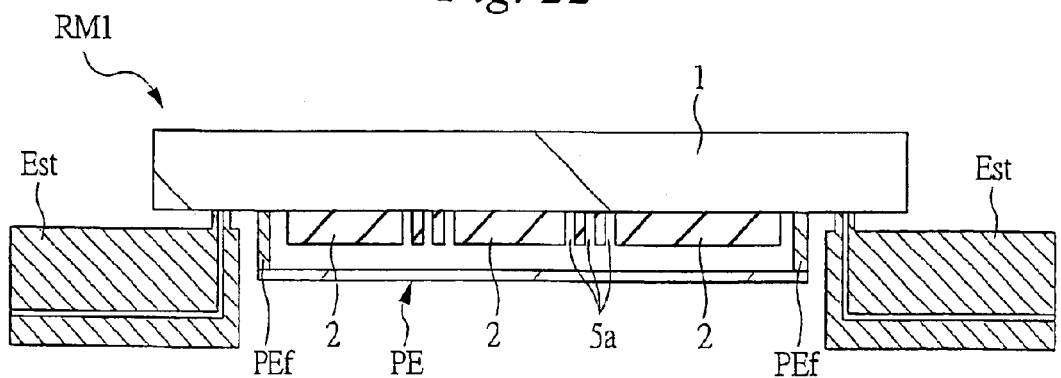
FIG. 22 is a cross-sectional view taken along the line Al—Al in FIG. 21.

A mask RM1 shown in FIGS. 21 and 22 is an example of a positive resist light-shielding mask. FIG. 21 is an entire plan view of the mask RM1, and FIG. 22 is a cross-sectional view taken along the line Al—Al in FIG. 21. A planar rectangular chip transfer region CAm, corresponding to a chip region on a wafer, is disposed at the center of the first main surface of the mask substrate 1 constituting the mask RM1. The outer periphery of the chip transfer region CAm serves as a peripheral region. The mask RM1 has characteristics, in which the chip transfer region CAm and some parts of the outer peripheral region thereof are covered with the positive electron beam sensitive resist film 2 for shielding light, but among them the adhesion portion of a pellicle frame PEf and contact portions of the various manufacturing devices to the mask substrate 1 are not covered with the electron beam sensitive resist film 2. Portions of the electron beam sensitive resist film 2 in the peripheral region of the mask RM1 are selectively removed by the electron beam writing, the ultraviolet exposure, the solvent peeling, or the like. In the chip transfer region CAm and the peripheral region on the mask RM1, some parts of the electron beam sensitive resist film 2 are removed to form a plurality of light-transmitting patterns 5a and 5b, respectively. The light-transmitting patterns 5a are transferred onto the wafer as integrated circuit patterns. Also, the light-transmitting patterns 5b are marks used in the alignment of the mask substrate 1 and the electron beam writing apparatus in transferring the integrated circuit patterns onto the mask substrate 1. Also, metal patterns 6a, formed in the peripheral region located outside the pellicle frame PEf of the pellicle PE, are marks used in the alignment of the mask RM and the wafer or of the mask RM and the reduction projection exposure apparatus, and are composed of, for example, a light-shielding metal film made of chromium or the like. In addition, four contact regions 7, each shown by the rectangular dotted line near the four corners of the pellicle PE in the peripheral region of the mask RM1, are portions which contact to vacuum suction holes of a stage Est of the reduction projection exposure apparatus.

Figure 23:
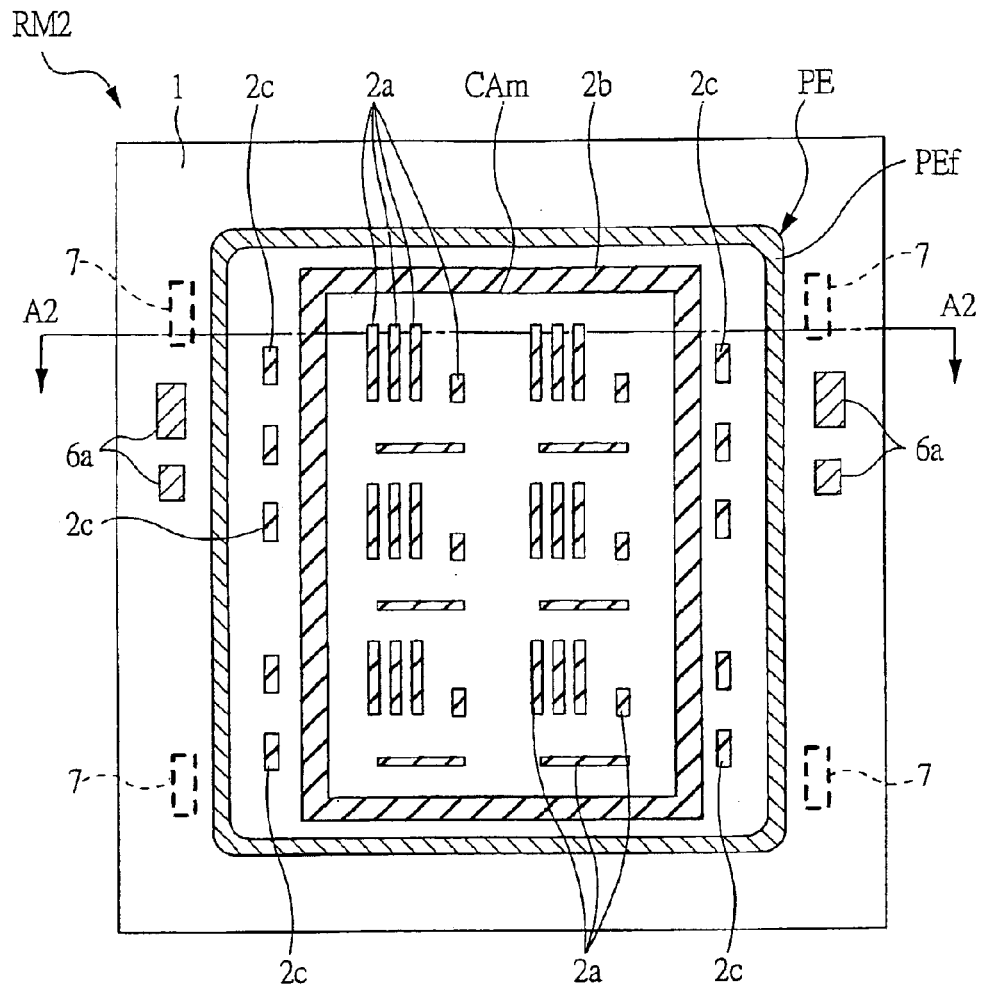
FIG. 23 is an entire plan view of a mask that is an embodiment of the present invention.
Figure 24:
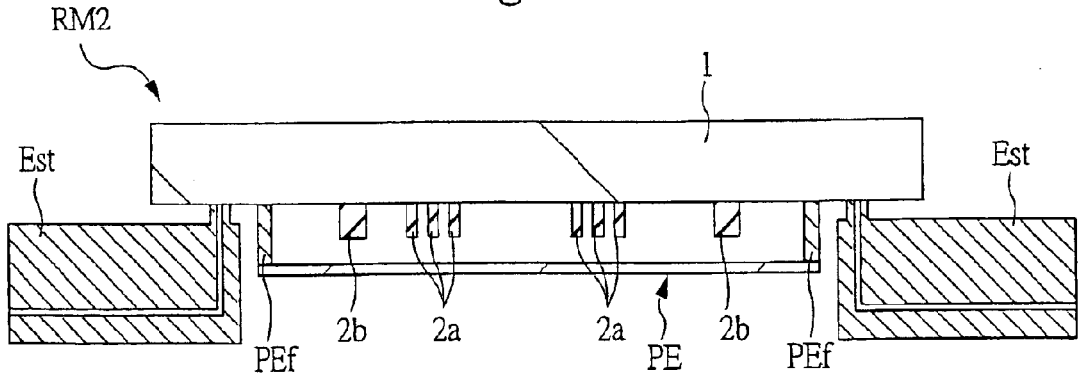
FIG. 24 is a cross-sectional view taken along the line A2—A2 in FIG. 23.

Next, a mask RM2 shown in FIGS. 23 and 24 is an example of a negative resist light-shielding mask. FIG. 23 is an entire plan view of the mask RM2, and FIG. 24 is a cross-sectional view taken along the line A2—A2 in FIG. 23. In the mask RM2 of this type that uses a negative-type film as the electron beam sensitive resist film for forming light-shielding portions, the mask can be fabricated by selectively leaving the resist patterns 2a, 2b, and 2c for forming the light-shielding portions by the electron beam writing and the ultraviolet exposure. Therefore, in the peripheral region of the mask RM2, the electron beam sensitive resist film at the contact portions or the like to the exposure apparatus is usually removed without performing particular removal. More specifically, it is unnecessary to add some special processes to remove the electron beam sensitive resist film in the peripheral region of the mask RM2. However, the mask RM2 is characterized in that a strip-shaped resist pattern 2b is disposed in order to prevent the patterns transferred onto the wafer by a step-and-repeat method or the like, from being multiple-exposed to each other. This resist pattern 2b is a light-shielding pattern arranged along the outer periphery of the chip transfer region CAm so as to define the region. A plurality of resist patterns 2a in the chip transfer region CAm are transferred as integrated circuit patterns onto the wafer. Also, a plurality of resist patterns 2c, disposed near the outer periphery of the frame-shaped resist pattern 2b in the peripheral region, are marks used in the alignment between the mask substrate 1 and the electron beam writing apparatus in transferring the integrated circuit patterns onto the mask substrate 1.

Figure 25:
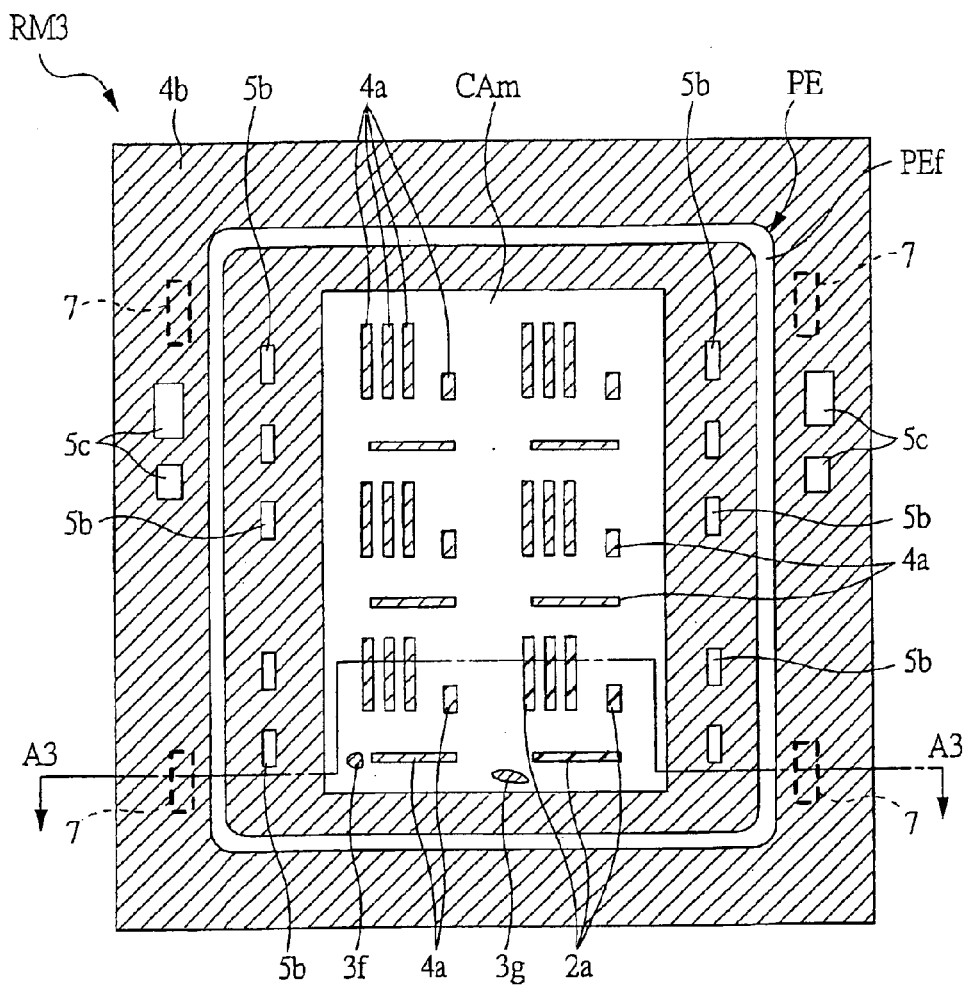
FIG. 25 is an entire plan view of a mask that is an embodiment of the present invention.
Figure 26:
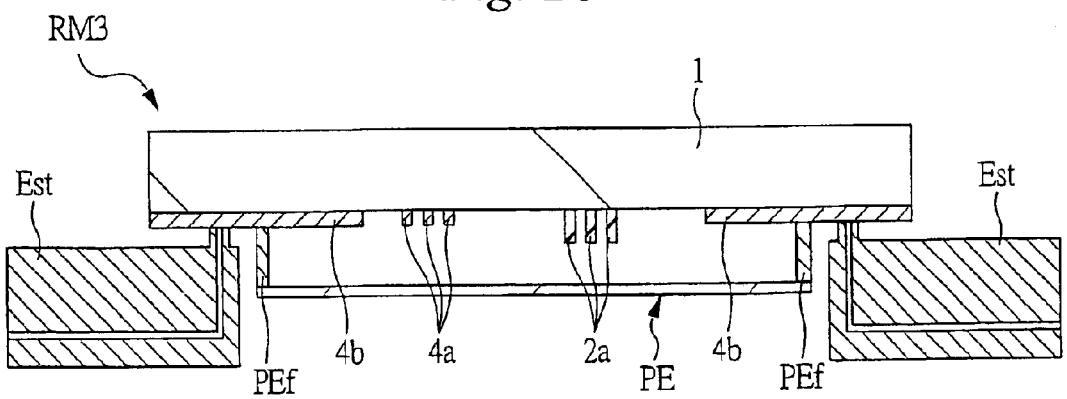
FIG. 26 is a cross-sectional view taken along the line A3—A3 in FIG. 25.

Next, a mask RM3 shown in FIGS. 25 and 26 is an example of a partial resist mask composed of a normal mask, parts of which are made of a resist light-shielding material. FIG. 25 is an entire plan view of the mask RM3, and FIG. 26 is a cross-sectional view taken along the line A3—A3 in FIG. 25. A plurality of metal patterns 4a for shielding light are arranged in the chip transfer region CAm of the mask RM3. Besides this, a plurality of resist patterns 2a for shielding light are disposed in a part area of the chip transfer region CAm. The metal patterns 4a and the resist patterns 2a are patterns used to transfer the integrated circuit patterns. The region from the outer periphery of the chip transfer region CAm to the outer periphery of the mask substrate 1 is covered with the metal pattern 4b. Some parts of the metal pattern 4b are removed to form a plurality of light-transmitting patterns 5b and 5c. The light-transmitting patterns 5b are mark patterns corresponding to the resist patterns 2c on the above-mentioned mask RM2. In addition, the light-transmitting patterns 5c are mark patterns corresponding to the metal patterns 6a on the above-mentioned mask RM2. The pellicle frame PEf is adhered to the metal pattern 4b. Also, the stage Est contacts to the metal pattern 4b. With regard to the mask RM3, defects in the metal patterns 4a and 4b are detected in advance by a normal chip comparison method or a method of comparing the design data and the mask pattern or the like, and if their repairs are needed, the patterns are appropriately repaired. Thereafter, the resist patterns 2a for shielding light are formed, and defect inspection is performed by the method according to the first embodiment, that is, the method that uses the foreign-matter inspection system. Portions other than the resist patterns 2a are also inspected by a simplified inspection method using the foreign-matter inspection system. As a result, it is possible to detect defects such as a foreign matter 3f or the like located at the position other than the forming region of the resist patterns 2a and a foreign matter 3g or the like located in the forming region of the resist patterns 2a, and thus assure the defect-free mask RM3. Note that the partial resist mask is described in, for example, Japanese Patent Application No. 2000-206728 and No. 2000-206729 (both filed on July 7, 2000) by the inventors of this invention.

Figure 27:
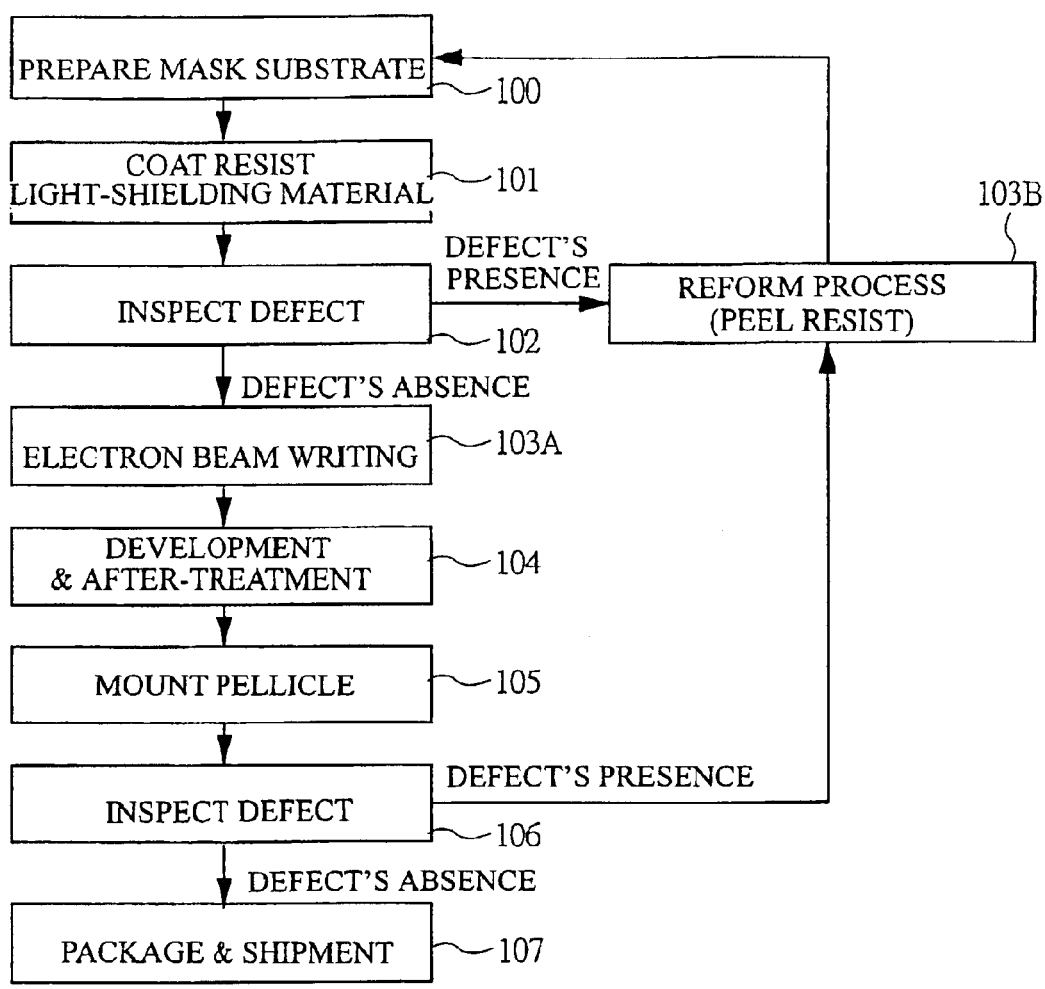
FIG. 27 is a flow chart of a manufacturing process of a mask, which is an embodiment of the present invention.

Next, FIG. 27 is a flow chart of a manufacturing process of the mask according to the first embodiment. First, the mask substrate 1 is prepared, and then the electron beam sensitive resist film 2 is coated on the first main surface of the mask substrate 1 by the following normal method (steps 100 and 101 in FIG. 27). Subsequently, the above-mentioned foreign-matter inspection (first inspection) is performed to the mask substrate 1, and the mask substrate 1 having no foreign matters passes the inspection and proceeds to the next step (steps 102 and 103A in FIG. 27). The mask substrate 1 having some foreign matters proceeds to a reform process and is reused as a new mask substrate 1 (step 103B in FIG. 27). In the reform process, the electron beam sensitive resist film 2 on the mask substrate 1 is peeled (removed). The mask substrate 1 having no foreign matters is exposed by, for example, an electron beam writing apparatus and a exposure apparatus that uses ultraviolet light and the like, and is developed by a normal method to form desirable resist patterns 2a, whereby the masks RM and RM1 to RM3 each having a resist light-shielding portion are fabricated (step 104 in FIG. 27). Thereafter, to prevent the adhesion of the foreign matters, the pellicle is immediately mounted thereon (step 105 in FIG. 27). Next, the fabricated masks RM and RM1 to RM3 are inspected (second inspection) by the use of the foreign-matter inspection system, and the defect-free masks RM and RM1 to RM3 are packaged and shipped (steps 106 and 107 in FIG. 27). If the foreign matters or the defects are discovered in the masks in this step, the masks proceed to the reforming step and the mask substrate 1 is reused (step 103B in FIG. 27).

As described above, since the foreign matters and the like are not transferred to another mask material (for example, chromium) in the masks RM and RM1 to RM3, each of which has any light-shielding portions composed of the resist film according to the first embodiment, it is possible to discriminate between mask patterns and defects such as foreign matters or the like. Therefore, in the first embodiment, it is possible to assure the absence of defects in the mask, without using the defect inspection for detecting the defects by the comparison inspection in inspecting the masks RM and RM1 to RM3. Accordingly, it is possible to simplify the inspection process of the mask and to reduce the inspecting time of the mask in comparison to the using of the comparison inspection. As a result, the mask can be fabricated at low cost and in a short time.

Figure 28:
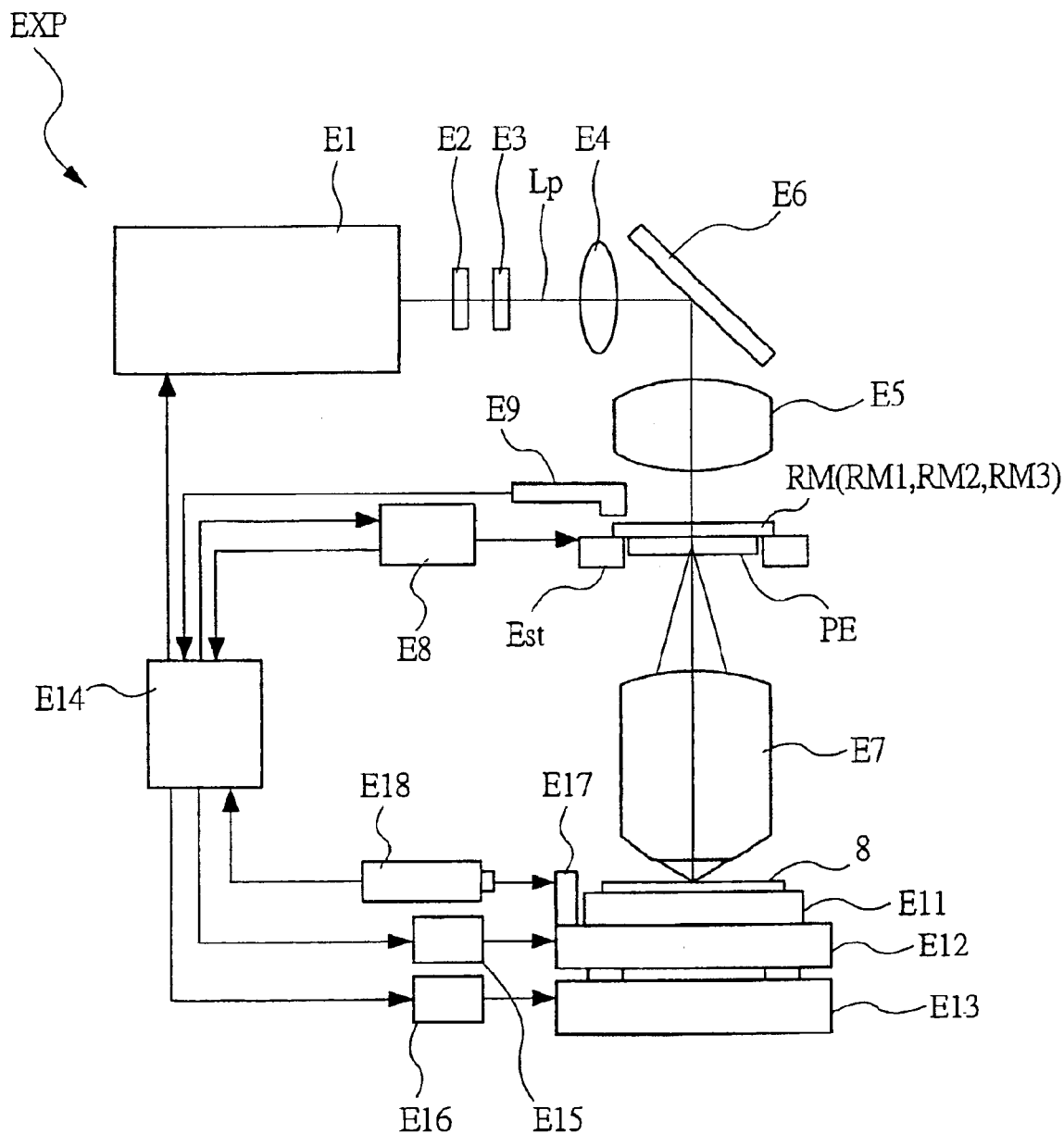
FIG. 28 is an explanatory diagram of an example of an exposure apparatus used in an embodiment of the present invention.

Next, an example of an exposure method that uses the above-described masks RM and RM1 to RM3 will be described with reference to FIG. 28. Note that only the components necessary to describe the function of the exposure apparatus are shown in FIG. 28. However, other components essential to an ordinary exposure apparatus (scanner and stepper) are the same as those in a usual case.

An exposure apparatus EXP is a scanning reduction projection exposure apparatus (scanner) having a reduction ratio of, for example, 4:1. The exposure conditions of the exposure apparatus EXP are, for example, as follows. That is, KrF excimer laser having an exposure wavelength of about 248 nm is used as exposure light Lp, numerical aperture NA of an optical lens is 0.65 (Na=0.65), a shape of illumination is circular, and a coherency (σ: sigma) value is 0.7 (σ=0.7). As a mask, resist masks such as the above-mentioned masks RM and Mm1 to Mm3 and normal masks are used. However, the exposure light Lp is not limited to the foregoing and can be variously modified. For example, g-line, i-line, ArF excimer laser (wavelength of 193 nm), or $F_2$ gas laser beam (wavelength of 157 nm) may be also used.

Light emitted from an exposure light source E1 is transmitted through a fly eye lens E2, an aperture E3, a condenser lenses E4 and E5, and a mirror E6 to illuminate the mask (a reticle in this case) RM. Of the optical conditions, the coherency is controlled by adjusting the size of an opening of the aperture E3. The above-mentioned pellicle PE is provided on the mask RM to prevent a pattern transfer failure or the like caused due to the adhesion of foreign matters. A mask pattern written on the mask RM is projected via a projection lens E7 onto a wafer 8 serving as a processed substrate. Note that the mask RM is placed on the mask stage Est controlled by a mask position control means E8 and a mirror E9, and the mask center and the optical axis of the projection lens E7 are accurately aligned. With the first main surface of the mask RM being directed toward the main surface (device surface) of the wafer 8 and with the second main surface thereof being directed toward the condenser lens E5, the mask RM is place on the stage Est. Therefore, the exposure light Lp is first irradiated to the second main surface side of the mask RM, transmits through the mask RM, and then, is irradiated to the projection lens E7 from the first main surface side of the mask RM.

The wafer 8 is held by vacuum suction on a specimen stage E11, with the main surface thereof being directed toward a side of the projection lens E7. The main surface of the wafer 8 is coated with a photoresist film sensitive to the exposure light. The specimen stage E11 is mounted on a Z stage E12, which is movable in a direction of an optical axis of the projection lens E7, that is, in a direction (Z direction) perpendicular to a substrate mounting surface of the specimen stage E11. Further, the specimen stage E11 is mounted on an XY stage E13, which is movable in a direction parallel to the substrate mounting surface of the specimen stage E11. The Z stage E12 and the XY stage E13 are driven by respective driving means E15 and E16 in response to control commands sent from a main control system E14. Therefore, the specimen stage E11 can be moved to any desired exposure positions. The positions are accurately monitored as a position of a mirror E17 fixed to the Z stage E13, by a laser measuring device E18. Also, a surface position of the wafer 8 is measured by a focus-position detecting means provided in an normal exposure apparatus. By driving the Z stage E12 in accordance with measurement results, the surface of the wafer 8 can be always coincided with an image forming surface of the projection lens E7.

The mask RM and the wafer 8 are synchronously driven in accordance with the reduction ratio, and the mask pattern is reduced and transferred onto the wafer 8 while the exposure region scans the mask RM. At this time, the surface position of the wafer 8 is also dynamically driven with respect to the scanning of the wafer 8 by the above-described driving means. In the case of overlap-exposing the circuit pattern on the mask RM with respect to the circuit pattern formed on the wafer 8, the positions of the mark patterns formed on the wafer 8 are detected by the use of an alignment detection optical system and the wafer 8 is positioned and overlap-transferred in accordance with detection result. The main control system E14 is electrically connected to a network device, which makes it possible to perform remote monitoring or the like of the state of the exposure apparatus EXP. In the foregoing description, the case where the scanning reduction projection exposure apparatus (scanner) is used as an exposure apparatus has been described. However, the exposure apparatus is not limited to this. For example, a reduction projection exposure apparatus (stepper) may be also used in which a wafer is repeatedly stepped with respect to a projected image of a circuit pattern on a mask, whereby the circuit pattern on the mask is transferred onto a desired position on the wafer.

According to the first embodiment as described above, it is possible to shorten the fabrication time of a mask and to achieve the shortening of the time for supplying the masks. Therefore, it is possible to largely shorten the development period and the manufacturing time of a semiconductor integrated circuit device manufactured by using the masks. Accordingly, the time for supplying the semiconductor integrated circuit devices can be shortened. Consequently, it is possible to deal with the development and manufacture of various kinds of low volume products, such as ASIC (Application Specific IC) or the like, that require early delivery. Also, since the mask cost can be reduced, it is possible to reduce the cost of the semiconductor integrated circuit device. Therefore, it is possible to reduce even the cost of products in which the cost reduction by mass production cannot be expected, such as ASIC or the like.

Next, an example of the semiconductor integrated circuit device, manufactured by the exposure method that uses the above-described masks RM and RM1 to RM3 and a normal mask, will be described with reference to FIG. 29.

Figure 29:
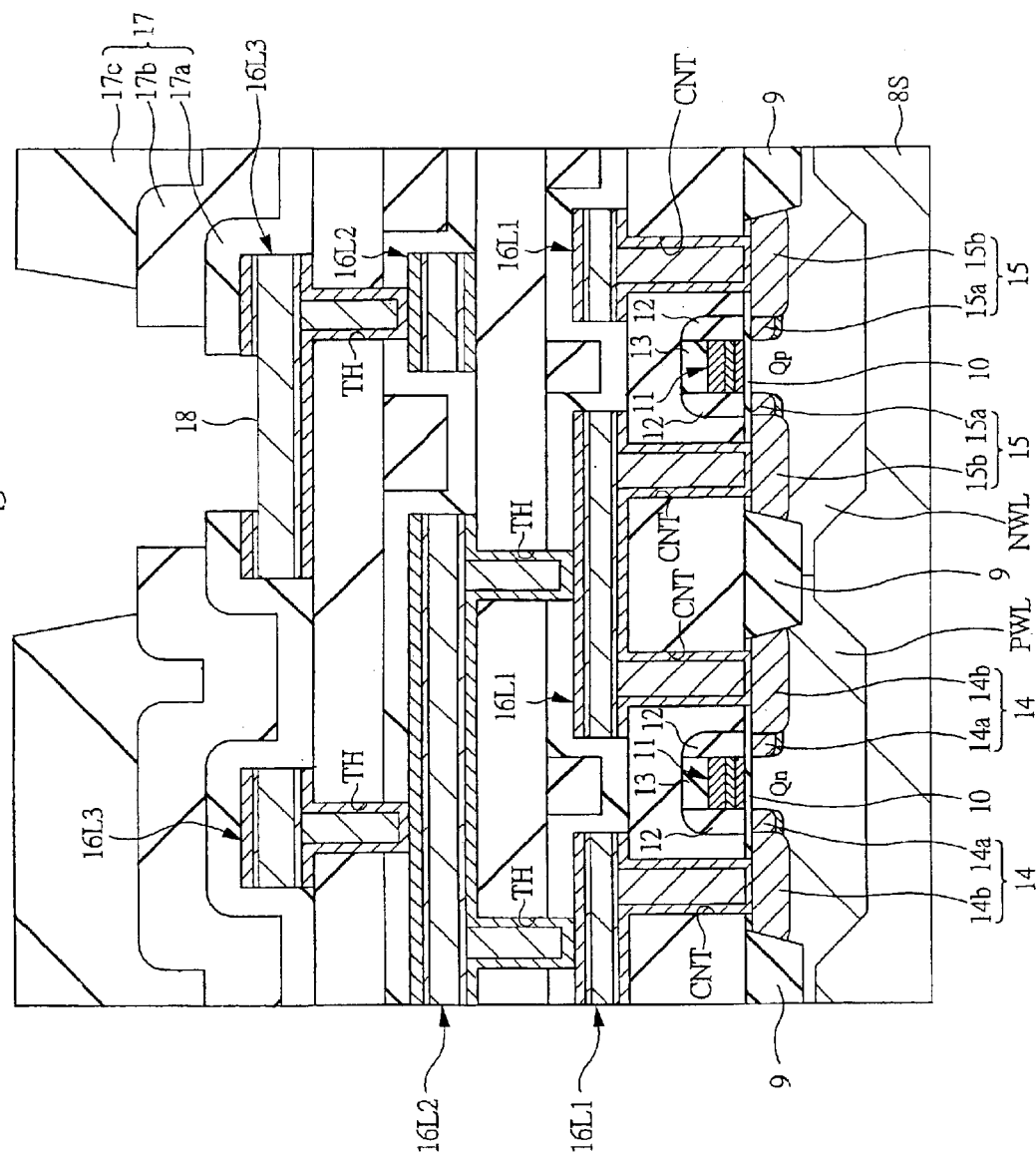
FIG. 29 is a cross-sectional view showing the principal part of an example of a semiconductor integrated circuit device according to an embodiment of the present invention.

FIG. 29 is a cross-sectional view showing the principal part of the semiconductor integrated circuit device. A semiconductor substrate (hereinafter, simply referred to as substrate) 8S, constituting a semiconductor chip cut out from the above-mentioned wafer 8, is made of, for example, p type single crystal silicon (Si) having a specific resistance of 1 to about 10 Ωcm. Trench-shaped isolations 9 are selectively formed in the main surface (device surface) of the substrate 8S. Each trench-shaped isolation 9 is formed by filling, for example, a silicon oxide film in a trench formed in the main surface of the substrate 8S. In this example, trench-shaped isolations (SGI (Shallow Groove Isolation) or STI (Shallow Trench Isolation)) are exemplified. However, it is also possible to form isolations composed of a silicon oxide ($SiO_2$ or the like) film by, for example, a LOCOS (Local Oxidization of Silicon) method or the like.

Also, a p type well PWL and an n type well NWL each extending from the main surface to a predetermined depth of the substrate 8S are selectively formed in the substrate 8S. For example, boron is introduced into the p type well PWL, and phosphorus is introduced into the n type well NWL. An nMIS Qn and a pMIS Qp are formed in respective active regions of the p type well PWL and the n type well NWL surrounded by the above-mentioned isolations 9. The NMIS Qn and the pMIS Qp constitute a CMIS circuit.

Gate insulating films 10 of the nMIS Qn and the pMIS Qp are composed of, for example, a silicon oxide film with a thickness of about 6 nm. The thickness of the gate insulating film 10 mentioned here is one obtained in terms of a silicon dioxide film, and it is not equal to the actual thickness in any cases. The gate insulating film 10 may be composed of a silicon oxynitride film instead of a silicon oxide film. More specifically, a structure may be used in which nitrogen is segregated at the interface between the gate insulating film 10 and the substrate 8S. Since the silicon oxynitride film has large effects of suppressing the occurrences of an interface level in the film and of reducing an electron trap in comparison to the silicon oxide film, it is possible to improve hot carrier resistance of the gate insulating film 10 and to improve insulation resistance. In addition, since the penetration of impurities through the silicon oxynitride film is more difficult than that through the silicon oxide film, the use of the silicon oxynitride film makes it possible to reduce variation in the threshold voltages caused by the diffusion of impurities in the gate electrode material into the side of the substrate 8S. The silicon oxynitride film may be formed by, for example, thermally performing the substrate BS in an atmosphere containing nitrogen gas such as NO, $NO_2$, or $NH_3$.

Gate electrodes 11 of the nMIS Qn and the pMIS Qp have a so-called polymetal gate structure, in which a metal film such as a tungsten (W) film or the like is laminated on a low-resistance polycrystalline silicon film via a barrier metal film such as a tungsten nitride (WN) film or the like. However, the structure of the gate electrode is not limited to this, and for example may use a single film structure of a low-resistance polycrystalline silicon film or a so-called polycide structure, in which a titanium silicide ($TiSi_x$) film or a cobalt silicide ($CoSi_x$) film is laminated on a low-resistance polycrystalline silicon film. Sidewalls 12 composed of, for example, a silicon oxide film are formed on the side surfaces of the gate electrode 11. In addition, a cap film 13 composed of, for example, a silicon oxide film or a silicon nitride ($Si_3N_4$ or the like) film or the like is formed on an upper surface of each gate electrode 11. Channels of the nMIS Qn and the PMIS Qp are formed in a part of the substrate BS immediately below the gate electrodes 11.

Semiconductor regions 14 for the source and drain of the nMIS Qn each have a so-called LDD (Lightly Doped Drain) structure, in which an $n^-$ type semiconductor region 14a and an $n^+$ type semiconductor region 14b are provided. Phosphorus (P) or arsenic (As) is introduced into both the $n^-$ type semiconductor region 14a and the $n^+$ type semiconductor region 14b. However, the impurity concentration of the $n^-$ type semiconductor region 14a is set lower than that of the $n^+$ type semiconductor region 14b. Meanwhile, Semiconductor regions 15 for the source and drain of the PMIS Qp each have a so-called LDD structure, in which a $p^-$ type semiconductor region 15a and a $p^+$ type semiconductor region 15b are provided. Boron (B) is introduced into both the $p^-$ type semiconductor region 15a and the $p^+$ type semiconductor region 15b. However, the impurity concentration of the $p^-$ type semiconductor region 15a is set lower than that of the $p^+$ type semiconductor region 15b.

A multiple wiring layer constituted of, for example, three layers is formed on such substrate 8S. The multiple wiring layer is formed by alternatively stacking up interlayer insulating films and wiring layers on the substrate 8S. First to third layer wirings 16L1 to 16L3 are formed in first to third wiring layers, respectively. Aluminum or aluminum-silicon-copper alloy is, for example, used as a main wiring material to form the first to third layer wirings 16L1 to 16L3. The lowermost first layer wiring 16L1 is electrically connected to the substrate 1S or the gate electrode 11 via contact holes CNT formed in the interlayer insulating film. Also, respective portions between the first to third layer wirings 16L1 to 16L3 are electrically connected via through holes TH formed in the interlayer insulating films. Most of the upper surface of the uppermost third layer wiring 16L3 is covered with a surface protection film 17. However, an opening is formed at a part of the surface protection film 17 to expose a part of the third layer wiring 16L3. The part of the third layer wiring 16L3 exposed from the surface protection film 17 serves as an external terminal region 18 to which a bonding wire or a bump electrode is bonded. Note that the surface protection film 17 is composed of protection films 17a to 17c stacked up in this order from the side of the substrate 8S. The lowermost protection film 17a is composed of, for example, a silicon oxide film or the like, and the protection film 17b thereon is composed of, for example, a silicon nitride film or the like, and the uppermost protection film 17c is composed of, for example, polyimide or the like. In transferring line patterns such as the active region (isolation region), the gate electrode 11, the first to third layer wirings 16L1 to 16L3, and the well region, etc., for example, a negative resist film is coated on the main surface of the wafer 8. In transferring hole patterns such as the contact hole CNT and the through hole TH, etc., for example, a positive resist film is coated on the main surface of the wafer 8.

(Second Embodiment)

Figure 30:
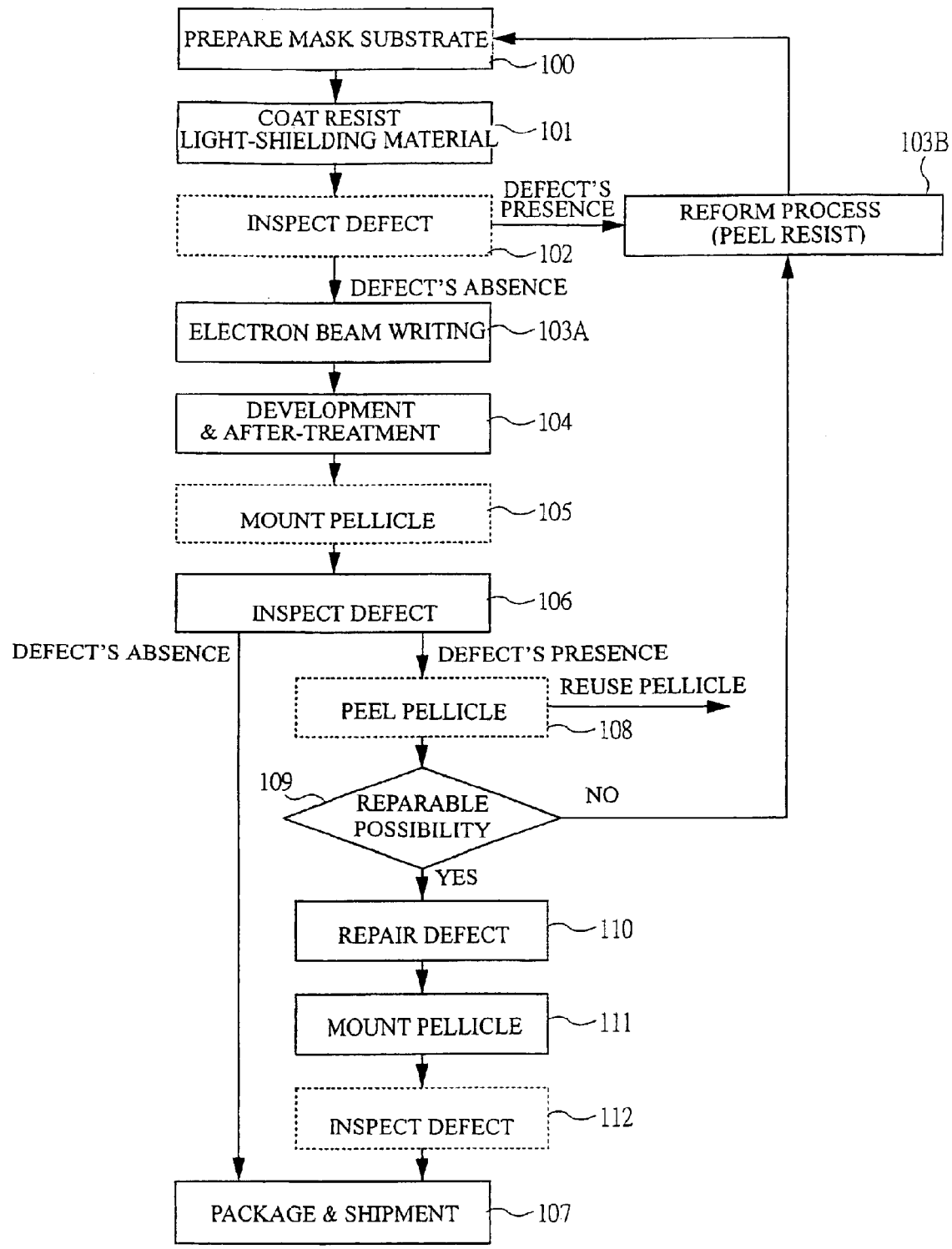
FIG. 30 is a flow chart of a manufacturing process of a mask, which is another embodiment of the present invention.

In a second embodiment, the case where the manufacturing flow of a mask includes a step of repairing the defects will be described. FIG. 30 is a flow chart showing an example of a manufacturing process of the mask. Since steps 100 to 107 in FIG. 30 are identical to those described in the first embodiment with reference to FIG. 27, the description thereof will be omitted. However, in the method according to the second embodiment, it is possible to eliminate either or both of the defect inspection step (step 102) and the pellicle mounting step (step 105).

According to the second embodiment, if it is determined in step 106 in FIG. 30 that there exist defects, the pellicle is removed (step 108 in FIG. 30). The removed pellicle is reused if possible. However, it is also possible to eliminate this pellicle removing step. Subsequently, it is examined whether or not defects on the mask can be repaired. If it is determined that it is impossible to repair the defects, the mask is reformed (steps 109 and 103B in FIG. 30). Meanwhile, if it is determined that it is possible to repair the defects, the defects of the mask are repaired (step 110 in FIG. 30). In the defect repairing step, a defect repairing technique used in a normal mask is used. For example, for repairing black defects on the mask, a laser beam (for example, YAG laser (wavelength: 0.53 μm)) or a focused, ion beam (FIB) is irradiated to black defective portions thereof, thereby removing the defective portions. In addition, for repairing white defects, the focused ion beam (for example, gallium (Ga) ions) is irradiated to defective portions thereof while organic gas is sprayed to the defective portions, thereby resolving the organic gas and depositing a carbonic film on the white defective portions to cover the white defective portions. Also, another method may be used in which ultraviolet laser light is irradiated to the defective portions in a Cr ($CO_6$) gas atmosphere, thereby forming chromium (Cr) on the white defective portions to cover the white defective portions. Immediately after the defect repairing, the pellicle is mounted again. Thereafter, the defect inspection identical to that in step 106 is performed to the mask (steps 111 and 112 in FIG. 30). If it is determined that there exist defects at this time, the process returns to step 108 and repeats the same sequence as that described above. If it is determined that there exist no defects on the masks, the defect-free masks RM and RM1 to RM3 are packaged and shipped (step 107 in FIG. 30). However, according to the examinations by the inventors of this invention, it is found out that the defect-free mask can be provided even if the last inspection step is not performed because the etching step of a metal film, in which foreign matters are most likely to adhere to a conventional mask, is eliminated in the case of the resist mask and therefore the occurrence of defects is extremely small.

Thus, the second embodiment has, besides the effects obtained in the first embodiment, the advantages of shortening the manufacturing time of the masks by executing the defect repairing step with respect to the small defects. Therefore, the shortening of the time for supplying the masks can be achieved. Also, since the expense for manufacturing of the mask can be reduced, it is possible to reduce the mask cost.

(Third Embodiment)

Figure 31:
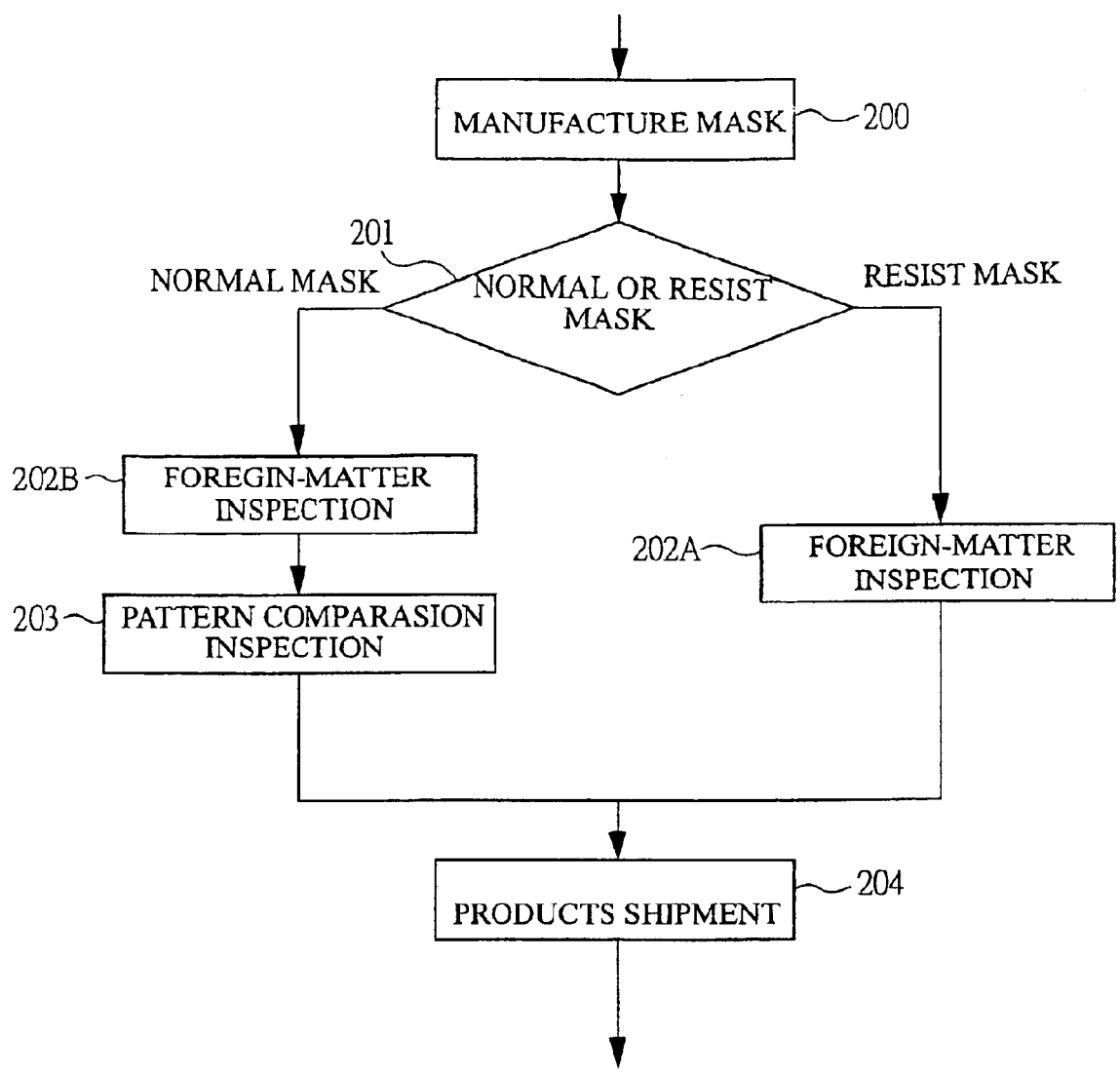
FIG. 31 is a flow chart of a manufacturing process of a mask, which is still another embodiment of the present invention.

In a third embodiment, a method to cope with the case where both a resist mask and a normal mask are present in a mask production line will be described. FIG. 31 is a flow chart showing an example of a manufacturing process of a mask according to the third embodiment. In this mask production line, the normal mask and the resist mask are manufactured depending on the use of the mask. In this case, since the defect inspection suitable for the mask is efficiently performed, the production efficiency can be improved. Therefore, in this embodiment, it is determined whether the mask is a normal mask or a resist mask (step 201 in FIG. 31) after the manufacture of the mask (step 200 in FIG. 31). If it is determined that the mask is a resist mask, the simplified defect inspection described in the first and second embodiments is employed (step 202A in FIG. 31). Meanwhile, when it is determined that the mask is a normal mask, the assurance of no defects is performed by using both the foreign-matter inspection and the pattern comparison inspection (steps 202B and 203 in FIG. 31). In this manner, the resist mask and the normal mask shipped as products (step 204 in FIG. 31). Note that there is no problem if operations for a pellicle or the like are performed in the same manner as those in a usual case, except such an operation that the pellicle does not contact to the resist film for shielding light. In addition, the defect inspection can be performed at the timing of following that of the usual method. However, in the case of the resist mask, it is efficient to perform the defect inspection after mounting the pellicle.

According to the third embodiment as described above, the following effect can be achieved in addition to those obtained in the first and second embodiments. That is, in the manufacturing process in which both the normal mask and the resist mask are manufactured in a production line, the inspection steps are separated depending upon the normal mask and the resist mask, which makes it possible to improve the entire production efficiency of the mask manufacturing process.

(Fourth Embodiment)

Next, in a fourth embodiment, a method for inspecting a resist mask used to transfer hole patterns such as the contact hole CNT and the thorough hole TH and the like shown in FIG. 29 will be described.

Figure 32:
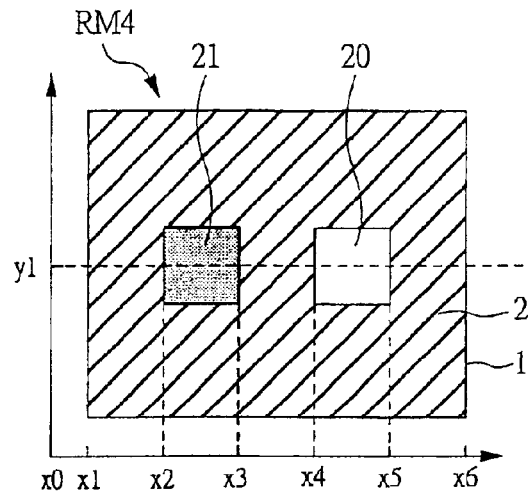
FIG. 32 is a plan view showing the principal part of a mask that is another embodiment of the present invention.
Figure 33:
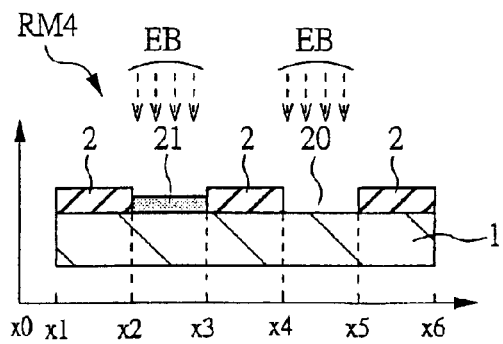
FIG. 33 is a cross-sectional view taken along the dotted line y1 in FIG. 32.
Figure 34:
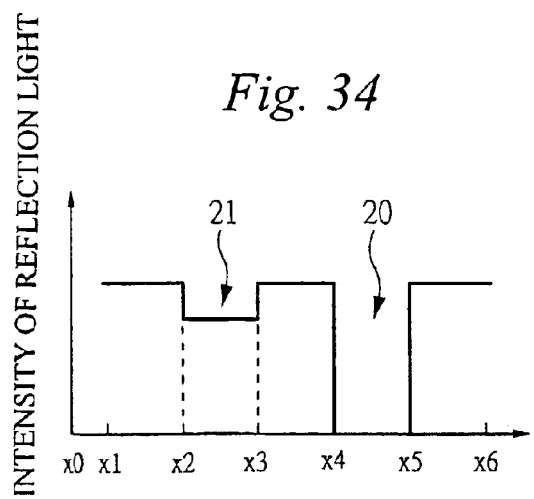
FIG. 34 is a waveform chart of the detection waveform of the mask shown in FIGS. 32 and 33, which is obtained by the foreign-matter inspection system.

In the case of the above-mentioned normal mask having the light-shielding portion made of chromium, it is impossible to detect the defects of incomplete openings of the hole patterns by the foreign-matter inspection system. In contrast, in the case of the resist mask, it is possible to detect the defects of incomplete openings of the hole patterns by the foreign-matter inspection system. FIG. 32 is a plan view showing the principal part of a mask (resist mask) RM4 for transferring the hole patterns after the electron beam writing process and the development process, and FIG. 33 is a cross-sectional view taken along the dotted line y1 in FIG. 32, and FIG. 34 shows the detection waveform of the mask RM4 in FIGS. 32 and 33 by the foreign-matter inspection system. The positions x0 to x6 each shown in FIGS. 32 to 34 indicate the same positions. In this case, a positive resist film is used as the electron beam sensitive resist film 2. The reference numeral 20 denotes an opening portion for transferring a hole pattern, and the reference numeral 21 denotes an incomplete opening portion designed to be opened. The rectangular opening portion 20 is a light-transmitting region formed by removing the electron beam sensitive resist film 2. In contrast, the incomplete opening portion 21 is a light-shielding region in which the electron beam sensitive resist film 2 is not completely removed and is left. However, the molecular structure of the incomplete opening portion 21 is changed due to the irradiation of the electron beam in comparison to that of the region to which the electron beam is not irradiated. In this case, an example is illustrated in which substances of the electron beam sensitive resist film 2 on the incomplete opening portion 21 are vaporized and dented. As a result, a color change in the incomplete opening portion 21 occurs in the inspection by the above-mentioned foreign-matter inspection system. More specifically, the detected color at the incomplete opening portion 21 is observed as a color different color from that at the other region. In addition, like the waveform of the detection light shown in FIG. 34, the incomplete opening portion 21 is observed so that the intensity of the detecting light (reflection light) thereof is attenuated in comparison to that of the periphery thereof. Therefore, the incomplete opening 21 of the mask RM4 after a development process can be detected, by the use of the foreign-matter inspection system CIS described in the first embodiment and the like and shown in FIG. 5 based on the change in the surface condition of the electron beam sensitive resist film 2. More specifically, in the foreign-matter inspection system, the information of the opening portion 20, the incomplete opening portion 21, and the electron beam sensitive resist film 2 of the mask RM4 after the development process can be detected and stored based on the change in the color represented by the difference of the hatching in FIG. 32 or on the appearance of the detection waveform shown in FIG. 33.

Also, in the case where a chemically amplified resist is used as the electron beam sensitive resist film 2, physical change such as film loss or the like may be scarcely found in some electron-beam irradiating portions of the electron beam sensitive resist film 2 immediately after the electron beam irradiation. Even in such a case, however, the physical change can be acknowledged after PEB (Post Exposure Bake). This is because acid produced in the electron-beam irradiating portions by the PEB is diffused due to heat, thereby starting a reaction in the electron beam sensitive resist film 2. Therefore, even in the case of such electron beam sensitive resist film 2, the discrimination between an electron-beam irradiating portion and an electron-beam un-irradiating portion can be made after the development by the foreign-matter inspection system, whereby it is possible to detect the defects. Note that the above-mentioned PEB is a mild thermal treatment performed to the mask after the exposure process and before the development process. Also, in the fourth embodiment, the case where the intensity of the reflection light from the incomplete opening portion 21 (defective portion) of the mask RM4 is relatively lower than that from the electron-beam un-irradiating portion of the electron beam sensitive resist film 2 has been exemplified. In some cases, however, the intensity of the reflection light from the incomplete opening portion 21 becomes relatively higher than that from the electron-beam un-irradiating portion of the electron beam sensitive resist film 2. Also, in this embodiment, the case where the reflection light from the mask RM4 is detected by the foreign-matter-and-defect inspection system has been described. However, the transmission light through the mask RM4 may be detected by the foreign-matter-and-defect inspection system similarly to the first to third embodiments. Alternatively, both the reflection light from the mask RM4 and the transmission light through the mask RM4 may be detected by the foreign-matter-and-defect inspection system similarly to the first to third embodiments. For example, it is also possible to improve detection sensitivity by obtaining the difference or the like between the reflection light and the transmission light. Even in any cases, the incomplete opening portion 21 can be detected by the foreign-matter inspection system.

Figure 35:
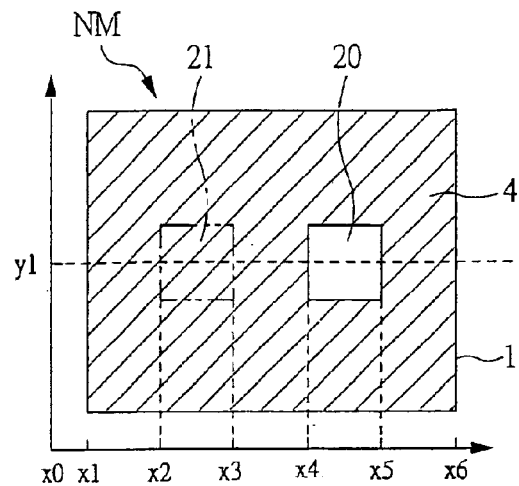
FIG. 35 is a plan view showing the principal part of a normal mask for transferring hole patterns.
Figure 36:
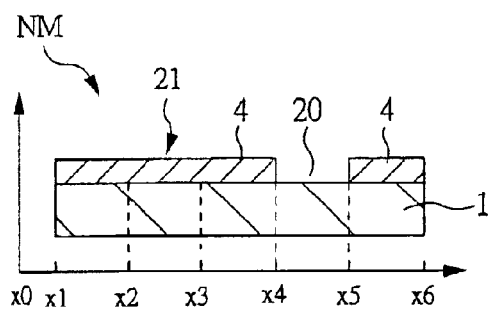
FIG. 36 Is a cross-sectional view taken along the dotted line y1 in FIG. 35.
Figure 37:
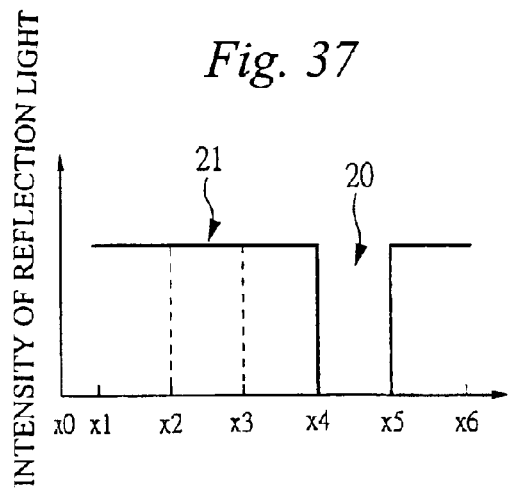
FIG. 37 is a waveform chart of the detection waveform of a normal mask shown in FIGS. 35 and 36, which is obtained by the foreign-matter inspection system.

For comparison, the case of the above-mentioned normal mask used to transfer the hole patterns is shown in FIGS. 35 to 37. FIG. 35 is a plan view showing the principal part of a normal mask NM for transferring hole patterns, and FIG. 36 is a cross-sectional view taken along the dotted line y1 in FIG. 35, and FIG. 37 shows the detection waveform of the normal mask NM in FIGS. 35 and 36, which is obtained by the foreign-matter inspection system. The positions x0 to x6 each shown in FIGS. 35 to 37 indicate the same positions. As shown in FIGS. 35 and 36, the incomplete opening portion 21 becomes a light-shielding region in which the metal film 4 is not completely removed and is left. As shown in FIG. 36, both film loss and chemical reaction do not occur in the incomplete opening portion 21 of the normal mask NM (therefore, no color change is caused). In addition, since the metal film 4 left in the incomplete opening portion 21 is made of the same material as that of the metal film 4 for forming the light-shielding region around the incomplete opening portion 21, the intensity of the reflection light from the incomplete opening portion 21 and that from the light-shielding region around the incomplete opening portion 21 obtained by the foreign-matter-and-defect inspection system are identical to each other as shown in FIG. 37. Therefore, it can be understood that it is impossible to discriminate the incomplete opening portion 21 in the normal mask NM.

Figure 38:
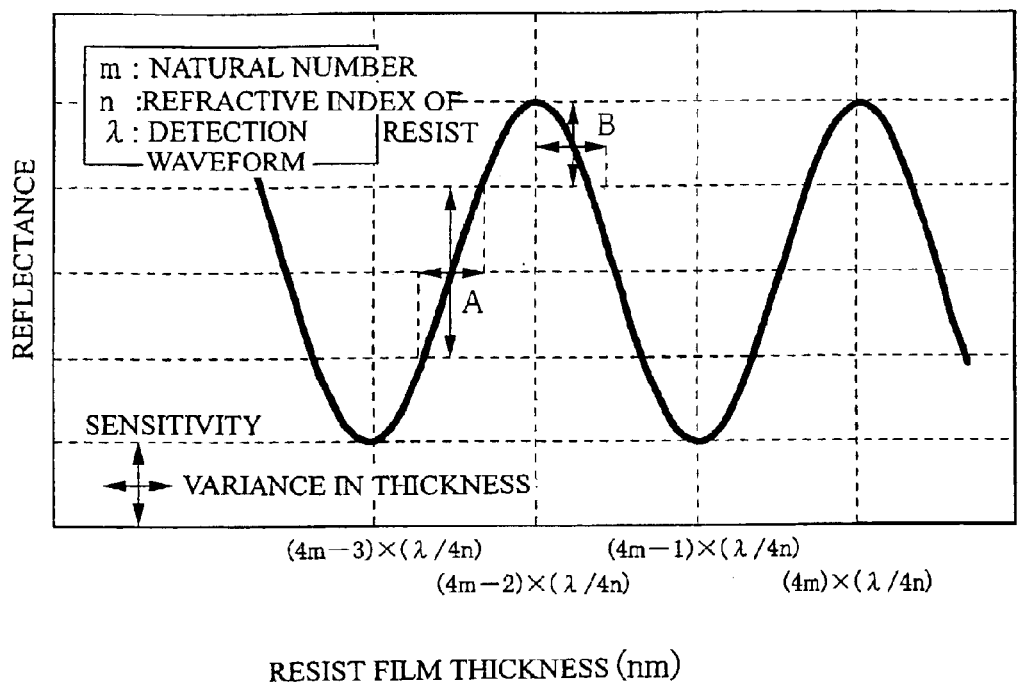
FIG. 38 is a waveform chart showing the relationship between the thickness of an electron beam sensitive resist film and the reflectance of the reflection light from the electron beam sensitive resist film obtained by inspection light of the foreign-matter inspection system.

Next, FIG. 38 shows the relationship between the thickness of the electron beam sensitive resist film 2 and the reflectance of the electron beam sensitive resist film 2 to the inspection light of the foreign-matter inspection system. The relationship between the film thickness and the reflectance of the electron beam sensitive resist film 2 forms a sine curve. That is, on the assumption that m is a natural number and n is refractive index of the electron beam sensitive resist film 2 and x is wavelength of the inspection light, the reflectance of the electron beam sensitive resist film 2 becomes minimum when the thickness of the electron beam sensitive resist film 2 satisfies the conditions of $(4m-3) \times (\lambda/4n)$ and/or $(4m-1) \times (\lambda/4n)$. Meanwhile, the reflectance of the electron beam sensitive resist film 2 becomes maximum when the thickness of the electron beam sensitive resist film 2 satisfies the conditions of $(4m-2) \times (\lambda/4n)$ and/or $4m \times (\lambda/4n)$. Therefore, it is possible to change the detection sensitivity in the foreign-matter inspection system by setting the thickness of the electron beam sensitive resist film 2 to a desired value. For example, when the thickness of the electron beam sensitive resist film 2 is set to the thickness obtained at a point A (which is such a point that $\theta$ of $\sin \theta$ is $0, \pi, 2\pi, 3\pi, \ldots$) in FIG. 38, a change in the thickness of the electron beam sensitive resist film 2 causes a large change in the reflectance. Therefore, high detection sensitivity in the foreign-matter inspection system can be obtained. In this case, however, there is the possibility that slight variation in the thickness of the electron beam sensitive resist film 2 will be detected as a dummy defect in spite of no defect. In contrast, when the thickness of the electron beam sensitive resist film 2 is set to the thickness obtained at a point B (which is such a point that $\theta$ of $\sin \theta$ is $\pi/2, 3\pi/2, 5\pi/2, \ldots$) in FIG. 38, the change in the reflectance due to the change in the thickness of the electron beam sensitive resist film 2 is smaller and the detection sensitivity in the foreign-matter inspection system is lower in comparison to those obtained at the point A. However, it is possible to reduce or prevent the drawback of detecting as the dummy defect the thickness variation in the electron beam sensitivity resist film 2 having no defect. According to the examinations by the inventors, for example, in the case where the diffraction index of the electron beam sensitive resist film 2 is 1.68 and the wavelength ($\lambda$) of the inspection light is 488 nm, the influence on the reflectance was large and the high sensitivity was obtained around the electron beam sensitive resist film having a thickness of 540 nm that corresponds to $m\lambda/4n$ (m is an odd number). Also, the influence on the reflectance was small and the low sensitivity was indicated around the electron beam sensitive resist film having a thickness of 580 nm that corresponds to $4m \times (\lambda/4n)$. Note that it is desirable that an optimum value of the thickness of the electron beam sensitive resist film 2 is obtained by examinations because, in a current technique, there are some errors in the controllability of the thickness of the electron beam sensitive resist film in the surface of the mask substrate 1 and the error between a calculated value and a measured value of the reflectance is increased with the increase of the thickness of the electron beam sensitive resist film and the like. It is preferable that the thickness of the electron beam sensitive resist film 2 is set to an optimum value in accordance with, for example, kinds (qualities) and/or processes of the resist film to be used and with reference to electron-beam-sensitive-resist-film thickness dependence of the reflectance on the above-mentioned inspection light. By so doing, the defects in the resist mask can be detected under the conditions suitable for each of the resist masks to be inspected. Note that since the manufacturing process of the mask RM4 for transferring hole patterns according to the fourth embodiment (including the defect inspection step executed by the foreign-matter inspection system) is the same as those described in the first to third embodiments, the description thereof is omitted.

(Fifth Embodiment)

In a fifth embodiment, an example of measures to deal with the case where an electron beam sensitive resist film of a resist mask is not changed (both physically and chemically) even after the electron beam exposure and the PEB will be described.

In the fifth embodiment, from the viewpoint that electron beam writing data is stored in the resist mask for transferring hole patterns, a reactant which reacts on electron-beam irradiating energy is applied to the positive electron beam sensitive resist film 2 in advance. By so doing, when electron beam is irradiated to a desired position on the electron beam sensitive resist film 2 of the resist mask, the reactant applied to the position to which the electron beam is irradiated is reacted to cause a chemical reaction (change in molecular structure or change in absorbance due to it). More specifically, by applying the reactant onto the above-mentioned electron beam sensitive resist film 2, the absorbance or the reflectance of the electron-beam writing portion to the inspection light of the foreign-matter inspection system differs from that of the electron-beam un-irradiating portion. As a result, even in the fifth embodiment similar to the above-mentioned fourth embodiment, the detected color in the incomplete opening portion 21 of the resist mask after the development is observed in a color different from that in the other region. Also, it is observed that the intensity of the detection waveform from the incomplete opening portion 21 is attenuated or intensified in comparison to periphery thereof. Therefore, even in the case where the electron beam sensitive resist film 2 itself is hardly changed after the electron beam exposure and the PEB process, the incomplete opening portion 21 of the resist mask can be surely detected by the use of the above-mentioned foreign-matter inspection system. As the above-mentioned reactant to be applied to the electron beam sensitive resist film 2, a light-absorbing agent such as an onium salt system material or tri-sulfonium-triflate or the like can be exemplified. Note that, since the manufacturing process of the resist mask for transferring hole patterns according to the fifth embodiment (including the defect inspection step executed by the foreign-matter inspection system) is the same as those described in the first to fourth embodiments, the description thereof is also omitted.

(Sixth Embodiment)

In a sixth embodiment, the case where a laser beam or the like is used instead of the electron beam in writing patterns on the electron beam sensitive resist film of the resist mask for transferring hole patterns will be described. Also in this case, a reactant that reacts on laser energy for pattern writing is applied in advance to the positive resist film for forming patterns on the resist mask. By so doing, since the reactant causes a chemical reaction at a laser-beam irradiating portion of the resist film of the resist mask, the absorbance or the reflectance or the like of the laser-beam irradiating portion to the inspection light of the foreign-matter inspection system differs from that of the laser-beam un-irradiating portion. Therefore, even in the case where the laser beam is used to write patterns on the resist film of the resist mask, the incomplete opening portion 21 of the resist mask can be surely detected by the use of the foreign-matter inspection system similarly to the fourth and fifth embodiments. As the laser writing apparatus used to write patterns on the resist film of the resist mask according to the sixth embodiment, ALTA-3000 (argon (Ar) laser beam with a wavelength of 364 nm) produced by ETEC systems, Inc. (USA) can be exemplified.

In the foregoing, the invention made by the inventors of the present invention has been concretely described based on the embodiments. However, it is needless to say that the present invention is not limited to the foregoing embodiments and can be variously modified and changed without departing from the gist thereof.

In the first to third embodiments, masks for transferring line patterns have been exemplified. However, the embodiments are not limited to this, and it is also possible to apply the present invention to a mask for transferring hole patterns such as contact holes and through holes and the like.

Also, metal patterns for forming light-shielding portions of the mask are not limited to ones made of chromium, and can be variously changed and modified. For example, a refractory metal film such as tungsten and molybdenum and the like, or a refractory metal nitride film obtained by nitriding the refractory metal film, or the like may be used.

Also, in the fourth to sixth embodiments, the case where defects such as incomplete opening portions 21 and the like are detected by the use of the foreign-matter inspection system after the development process for forming patterns of a resist mask has been described. However, for example, after the electron beam wiring for forming the above-mentioned patterns and before the development process, electron-beam writing information on a surface of the electron beam sensitive resist film 2 of the resist mask is inspected by the foreign-matter inspection system and the electron-beam writing information and a design drawing are compared, whereby whether or not the electron beam writing is performed in accordance with the design drawing may be detected. In this case, if there are observed some portions in which a color change must be made but the color change is not made actually by the use of the foreign-matter inspection system, then it can be understood that the electron beam is not correctly irradiated to the portions, namely, the portions will be some defects. Therefore, if such defect candidates are found, the electron beam is again written on defect candidate portions of the electron beam sensitive resist film 2 and thereafter the development process is performed, whereby defects such as the above-mentioned incomplete opening portions 21 or the like can be prevented from occurring on the resist film.

In the foregoing description, the cases where the invention made by the inventors is mainly applied to the method of manufacturing a semiconductor integrated circuit device with a CMIS circuit, which is an utilizing field included in the background thereof. However, the present invention is not limited to this, and can be applied to the methods of manufacturing various kinds of semiconductor integrated circuit devices, for example, a semiconductor integrated circuit device having a memory circuit such as a DRAM (Dynamic Random Access Memory), an SRAM (Static Random Access Memory), a flash memory (EEPROM: Electric Erasable Programmable Read Only Memory) or the like; a semiconductor integrated circuit device having a logic circuit such as a microprocessor or the like; a mixed-type semiconductor integrated circuit device on which the above-mentioned memory circuit and logic circuit are provided on the same semiconductor substrate; or the like. In addition, it is also possible to apply the present invention to: a method of manufacturing a liquid crystal display and a micro machine; a method that includes exposure and transfer steps of fine patterns: or the like.

The advantages obtained by the typical ones of the inventions disclosed in the present application will be briefly described as follows.

That is, in the inspection of a mask having a light-shielding portion composed of a resist film, optical information on either or both of reflection light and transmission light with respect to inspection light irradiated to a mask is read to inspect the mask, whereby the inspection time of a mask can be reduced and the manufacturing time of a mask can be reduced and the shortening of the time for supplying the masks can be realized.

Also, since the shortening of the time for supplying the masks in realized, the manufacturing time of a semiconductor integrated circuit device manufactured by the use of the masks can be reduced. As a result, the shortening of the time for supplying the semiconductor integrated circuit devices can be realized.

What is claimed is:

1. A method of manufacturing a mask in which a light-shielding portion to an exposure light is composed of a resist film, the method comprising the step of inspecting said mask by reading optical information on both of reflection light from the mask and transmission light passing through the mask with respect to inspection light irradiated to the mask, and comparing the optical information on reflection light from the mask with optical information on transmission light passing through the mask.

2. The method of manufacturing a mask according to claim 1, wherein said mask is inspected by a foreign-matter inspection system.

3. A method of manufacturing a mask, comprising the steps of:
 (a) preparing a mask substrate;
 (b) depositing, on a first main surface of said mask substrate, a resist film having a light-shielding property with respect to an exposure light used in an exposure process that employs a mask;
 (c) after said step (b), performing a first inspecting process of readout-inspecting optical information on either or both of reflection light and transmission light with respect to inspection light irradiated to said mask substrate;
 (d) transferring a pattern onto the resist film on said mask substrate by the exposure process, and thereafter forming a resist pattern by performing a development process; and
 (e) after said step (d), performing a second inspecting process of readout-inspecting optical information of either or both of reflection light and transmission light with respect to inspection light irradiated to said mask substrate, without performing a comparison inspection.

4. The method of manufacturing a mask according to claim 3, wherein a foreign-matter inspection system is used in said first and second inspecting processes.

5. The method of manufacturing a mask according to claim 3, further comprising the step of removing said resist film to reform said mask substrate if the presence of a defect is determined in said first inspecting process.

6. The method of manufacturing a mask according to claim 3, further comprising the step of removing said resist pattern to reform said mask substrate if the presence of a defect is determined in said second inspecting process.

7. The method of manufacturing a mask according to claim 3, further comprising the step of repairing a defect if the presence of the defect is determined in said second inspecting process.

8. The method of manufacturing a mask according to claim 3, further comprising the step of mounting a pellicle on a first main surface side of said mask substrate after said step (d) and before said step (e).

9. A method of manufacturing a mask, comprising the steps of:
 (a) preparing a mask substrate;
 (b) depositing, on a first main surface of said mask substrate, a resist film having a light-shielding property with respect to an exposure light used in an exposure process that employs a mask;
 (c) transferring a pattern onto the resist film on said mask substrate by the exposure process, and thereafter forming a resist pattern by performing a development process; and
 (d) after said step (c), performing an inspecting process of readout-inspecting optical information on both of reflection light from the mask and transmission light through the mask with respect to inspection light irradiated to said mask substrate, and comparing the optical information on reflection light from the mask with optical information on transmission light passing through the mask.

10. The method of manufacturing a mask according to claim 9, wherein a foreign-matter inspection system is used in said inspecting process.

11. The method of manufacturing a mask according to claim 9, further comprising the step of repairing a defect if the presence of the defect is determined in said inspecting process.

12. The method of manufacturing a mask according to claim 9, further comprising the step of mounting a pellicle on a first main surface side of said mask substrate after said step (c) and before said step (d).

13. A method of manufacturing a mask, comprising the steps of:
(a) preparing a mask substrate;
(b) depositing, on a first main surface of said mask substrate, a metal film having a light-shielding property with respect to an exposure light used in an exposure process that employs a mask;
(c) processing said metal film to form a metal pattern;
(d) performing an inspecting process of inspecting the mask after said step (c);
(e) depositing, on a first main surface of said mask substrate, a resist film having a light-shielding property with respect to an exposure light used in an exposure process that employs a mask;
(f) after said step (e), performing a first inspecting process of readout-inspecting optical information on either or both of reflection light and transmission light with respect to inspection light irradiated to said mask substrate;
(g) transferring a pattern onto the resist film on said mask substrate by the exposure process, and thereafter forming a resist pattern by performing a development process; and
(h) after said step (g), performing a second inspecting process of readout-inspecting optical information on either or both of reflection light and transmission light with respect to inspection light irradiated to said mask substrate, without performing a comparison inspection.

14. The method of manufacturing a mask according to claim 13, wherein a foreign-matter inspection system is used in said first and second inspecting processes.

15. The method of manufacturing a mask according to claim 13, further comprising the step of removing said resist film to reform said mask substrate if the presence of a defect is determined in said first inspecting process.

16. The method of manufacturing a mask according to claim 12, further comprising the step of removing said resist pattern to reform said mask substrate if the presence of a defect is determined in said second inspecting process.

17. The method of manufacturing a mask according to claim 13, further comprising the step of repairing a defect if the presence of the defect is determined in said second inspecting process.

18. The method of manufacturing a mask according to claim 13, further comprising the step of mounting a pellicle on a first main surface side of said mask substrate after said step (g) and before said step (h).

19. A method of manufacturing a mask, comprising the steps of:
(a) determining whether a manufactured mask is a first mask having a light-shielding portion composed of a resist film or a second mask having a light-shielding portion composed of a metal film; and
(b) changing an inspecting method of the mask depending on the result of said determination.

20. The method of manufacturing a mask according to claim 19, wherein, if it is determined that the mask manufactured in said step (a) is the first mask, the first mask is inspected in said step (b) by reading optical information on either or both of reflection light and transmission light with respect to inspection light irradiated to said first mask, without performing a comparison inspection.

21. The method of manufacturing a mask according to claim 19, wherein, if it is determined that the mask manufactured in said step (a) is the second mask, said step (b) includes the steps of:
(b1) inspecting the second mask by reading optical information on either or both of reflection light and transmission light with respect to inspection light irradiated to said second mask; and
(b2) inspecting said second mask by a comparison inspection method.

22. A method of manufacturing a semiconductor integrated circuit device, comprising the steps of:
(a) fabricating a mask having a light-shielding portion composed of a resist film;
(b) inspecting said mask by reading optical information on both of reflection light from the mask and transmission light passing through the mask with respect to inspection light irradiated to the mask, comparing the optical information on reflection light from the mask with optical information on transmission light passing through the mask; and
(c) transferring a desired pattern onto a resist film on a wafer by a reduction projection exposure process that employs the mask.

23. A method of manufacturing a mask for transferring hole patterns, the mask in which a light-shielding portion to an exposure light is composed of a positive resist film, the method comprising the step of inspecting the mask, which includes an inspecting process of detecting an incomplete opening portion of said positive resist film on said mask by reading optical information on either or both of reflection light and transmission light with respect to inspection light irradiated to said mask.

24. The method of manufacturing a mask according to claim 23, further comprising the steps of: transferring, by a predetermined energy beam, hole patterns onto said positive resist film containing a reactant reacting on the predetermined energy beam; and thereafter detecting said incomplete opening portion by said inspecting process.

25. The method of manufacturing a mask according to claim 23, wherein, in said inspecting process, said incomplete opening portion is detected by a change in the intensity of either or both of reflection light and transmission light of the incomplete opening portion with respect to said inspection light.

26. The method of manufacturing a mask according to claim 23, wherein said inspecting process is performed after mounting a pellicle on said mask.

27. The method of manufacturing a mask according to claim 23, wherein detection sensitivity of either or both of the reflection light and the transmission light with respect to said inspection light is controlled by adjusting the thickness of said positive resist film.

28. A method of manufacturing a mask, comprising the steps of:
(a) preparing a mask substrate;
(b) depositing, on a first main surface of said mask substrate, a positive resist film having a light-shielding property with respect to an exposure light used in an exposure process that employs a mask;
(c) transferring a hole pattern onto the resist film on said mask substrate by an exposure process employing a predetermined energy beam;
(d) performing a development process to said mask after said step (c); and
(e) performing an inspecting process of detecting an incomplete opening portion of said positive resist film on said mask by reading optical information on either or both of reflection light and transmission light with respect to inspection light irradiated to said mask substrate.

29. The method of manufacturing a mask according to claim 28, wherein said positive resist film contains a reactant reacting on said predetermined energy beam.

30. The method of manufacturing a mask according to claim 28, wherein, in the inspecting process of said step (e), said incomplete opening portion is detected by a change in the intensity of reflection light of the incomplete opening portion with respect to said inspection light.

31. The method of manufacturing a mask according to claim 28, wherein the inspecting process in said step (e) is performed after mounting a pellicle on said mask after said step (d).

32. The method of manufacturing a mask according to claim 28, wherein detection sensitivity of either or both of the reflection light and the transmission light with respect to said inspection light is controlled by adjusting the thickness of said positive resist film.

33. A method of manufacturing a semiconductor integrated circuit device, comprising the steps of:
   (a) fabricating a mask for transferring a hole pattern, the mask having a light-shielding portion composed of a positive resist film;
   (b) inspecting said mask, the inspecting step including an inspecting process of detecting an incomplete opening portion of said positive resist mask on said mask by reading optical information on both of reflection light from the mask and transmission light passing through the mask with respect to inspection light irradiated to the mask, and comparing the optical information on reflection light from the mask with optical information on transmission light passing through the mask; and
   (c) transferring a hole pattern onto a resist film on a wafer by performing a reduction projection exposure process that employs the mask.

34. The method of manufacturing a mask according to claim 1, wherein said comparing includes comparing intensity of the transmission light with intensity of the reflection light.

35. The method of manufacturing a mask according to claim 9, wherein said comparing includes comparing intensity of the transmission light with intensity of the reflection light.

36. The method of manufacturing a semiconductor device according to claim 22, wherein said comparing includes comparing intensity of the transmission light with intensity of the reflection light.

37. The method of manufacturing a semiconductor device according to claim 33, wherein said comparing includes comparing intensity of the transmission light with intensity of the reflection light.

38. A method of manufacturing a mask, comprising the steps of:
   (a) preparing a mask substrate;
   (b) depositing, on a first main surface of said mask substrate, a resist film having a light-shielding property with respect to an exposure light used in an exposure process that employs a mask;
   (c) transferring a pattern onto the resist film on said mask substrate by the exposure process, and thereafter forming a resist pattern by performing a development process;
   (d) after said step (c), performing an inspecting process of readout-inspecting optical information on either or both of reflection light and transmission light with respect to inspection light irradiated to said mask substrate, without performing a comparison inspection; and
   (e) removing said resist pattern to reform said mask substrate if the presence of a defect is determined in said inspecting process.

* * * * *